United States Patent [19]
Ishikawa et al.

[11] Patent Number: 5,786,607
[45] Date of Patent: *Jul. 28, 1998

[54] SOLID-STATE IMAGE PICK-UP DEVICE AND METHOD FOR MANUFACTURING THE SAME

[75] Inventors: Katsuya Ishikawa, Kyoto; Takao Kuroda; Yuji Matsuda, both of Osaka; Masahiko Niwayama, Kyoto; Keishi Tachikawa, Osaka, all of Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 654,962

[22] Filed: May 29, 1996

[51] Int. Cl.⁶ .................... H01L 27/148; H01L 29/768
[52] U.S. Cl. .................................... 257/225; 257/229
[58] Field of Search ................................ 257/225, 229

[56] References Cited

U.S. PATENT DOCUMENTS 4,514,894  5/1985  Kawagoe.

FOREIGN PATENT DOCUMENTS 4-199878  7/1992  Japan.

*Primary Examiner*—Stephen Meier
*Attorney, Agent, or Firm*—Morrison & Foerster LLP

[57] ABSTRACT

A solid-state image pick-up device having a structure in which the amount of transferred charges is not reduced in a vertical CCD portion even if a pixel portion is made finer, and a method for manufacturing the solid-state image pick-up device are provided. A first p-type well and a second p-type well are formed on an N (100) silicon substrate. A vertical CCD $n^+$ layer is formed in the second p-type well 3. Then, impurity ions are implanted into a surface layer of the N (100) silicon substrate including an upper layer portion of the vertical CCD $n^+$ layer to form a $p^-$ layer. An isolating portion for isolating photodiode portions from the vertical CCD $n^+$ layer and a read control portion for controlling the read of charges from the photodiode n layer are simultaneously formed on a portion adjacent to the vertical CCD $n^+$ layer.

8 Claims, 21 Drawing Sheets

SOLID-STATE IMAGE PICK-UP DEVICE AND METHOD FOR MANUFACTURING THE SAME

FIELD OF THE INVENTION

The present invention relates to a solid-state image pick-up device and a method for manufacturing the same, and more particularly to a solid-state image pick-up device which does not lower the amount of transferred charges even if a pixel portion is made finer and a method for manufacturing the solid-state image pick-up device.

BACKGROUND OF THE INVENTION

FIG. 10 is a sectional view showing the structure of a photodiode portion (which stores light as charges by photoelectric transfer) and a vertical CCD portion provided in a pixel portion of a CCD that is used as a solid-state image pick-up device for a video camera or the like according to the prior art. In FIG. 10, a first p-type well 2 is formed on an N (100) silicon substrate 1, and a second p-type well 3 and a photodiode n layer 8 are formed in the first p-type well 2. A vertical CCD n$^+$ layer 4 is formed in the second p-type well 3. An embedded photodiode p$^+$ layer 9 is formed in the photodiode n layer 8. A p$^-$ area 16 which controls the read of charges from the photodiode n layer 8 to the vertical CCD n$^+$ layer 4 is formed in one of areas adjacent to the vertical CCD n$^+$ layer 4 in the second p-type well 3 on the first p-type well 2. A p$^+$ area 15 which electrically isolates the vertical CCD n$^+$ layer 4 from the photodiode n layer 8 adjacent thereto is formed in the other area adjacent to the CCD n$^+$ layer 4. A gate insulating film 6 is formed on the surface of the n-type silicon substrate 1. A polysilicon electrode 7 is formed on the surface of a portion of the gate insulating film 6 which covers the vertical CCD portion 4. The embedded photodiode p$^+$ layer 9 is formed for the countermeasure against a dark current. The polysilicon electrode 7 functions as an electrode for controlling the read of the charges from the photodiode portion in the vertical CCD portion and the transfer of the read charges, i.e. a read and transfer electrode. The vertical CCD n$^+$ layer 4 is formed by implantation of arsenic and phosphorus so as to obtain high transfer efficiency.

FIG. 11 is a conceptual view showing the state of impurity diffusion in the vertical CCD n$^+$ layer (hereinafter referred to as a vertical CCD n$^+$ area) 4 and the peripheral area thereof in the pixel portion of the solid-state image pick-up device according to the prior art shown in FIG. 10. As shown in FIG. 11, p-type impurities are diffused from a p$^-$ area 16 and a p$^+$ area 15 to the vertical CCD n$^+$ area 4 and n-type impurities are diffused from the vertical CCD n$^+$ area 4 to the p$^-$ area 16 and the p$^+$ area 15 when forming the p$^-$ area 16 and the p$^+$ area 15 adjacently to the vertical CCD n$^+$ area 4 in the solid-state image pick-up device according to the prior art shown in FIG. 10. Accordingly, a true p$^+$ area 15, an impurity diffusion area 4a in which the p$^+$ area 15 and the vertical CCD n$^+$ area 4 overlap each other, a true vertical CCD n$^+$ area 4, an impurity diffusion area 4b in which the vertical CCD n$^+$ area 4 and the p$^-$ area 16 overlap each other, and a true p$^-$ area 16 are formed sequentially from the A side corresponding to the line A-B shown in FIG. 11.

FIG. 23 is a sectional view typically showing the structure of a pixel portion of a CCD solid-state image pick-up device according to another prior art. A p-type area 206 is selectively formed on the surface portion of a p-type well 202 in an n-type semiconductor substrate 201 so as to connect an n-type area 209 of a photodiode and an n-type area 204 as a CCD transfer channel. A p-type area 207 is selectively formed on the surface portion of the p-type well 202 so as to connect the n-type area 204 to the n-type area 209 in contact with the n-type area 204 on an end which is not in contact with the p-type area 206. A p-type area 283 is positioned just below the n-type area 204 in the p-type well 202 in such a manner that the n-type area 204 is enclosed by the p-type area 206 for isolation and the p-type area 207 for read drive voltage control. A signal charge non-reading side area is shown by a solid line 286 and a signal charge reading side area is shown by a solid line 285.

According to the method for manufacturing the CCD solid-state image pick-up device according to the prior art described above, boron ions are implanted into the predetermined area of the p-type well 202 by using a photoresist as a mask in order to optimize the read drive voltage, sensitivity, smear, saturation characteristic and the like. Thus, the p-type area 283 is formed. Then, a photoresist is applied, exposed and developed to form a mask. Thus, the n-type area 204 as a CCD transfer channel is formed.

In a CCD solid-state image pick-up device which has widely been used in a video camera, the area for each pixel has been reduced more with the miniaturization of the video camera, the enhancement of precision for a HDTV, and the appearance of a total pixel CCD for multimedia use. For this reason, it is necessary to make the CCD and the photodiode finer without deteriorating D-range, transfer efficiency, sensitivity, smear, after-image and the like. For example, a method for forming an impurity area by using high-acceleration ion implantation and low-temperature heat treatment is very effective to make the CCD and the photodiode finer. By this method, it is possible to prevent unnecessary diffusion of impurities from the n- or p-type area to the undesired area and to form an impurity area having a desired concentration in a portion having a desired depth in the minute area. According to a structure in which the p-type area 283 is formed just below the n-type area 204 as the CCD transfer channel according to the prior art, however, a p-type area having a locally high concentration is formed in the very vicinity of the CCD transfer channel 204 and the photodiode 209. Consequently, various problems arise.

A deterioration in read drive voltage will be described with reference to FIGS. 14 and 15.

FIG. 14 is an enlarged sectional view showing a signal reading side area 285 according to the prior art. An area 233 indicates a p-type area provided just below a CCD transfer channel 204. The p-type area 233 having an end at position 237 is the same as the p-type area 283 according to the prior art shown in FIG. 23. A dashed line 236 indicates a signal reading channel which is formed from a photodiode 209 to the CCD transfer channel 204. Other portions typically show the sectional structure of a pixel of a CCD solid-state image pick-up device according to the prior example shown in FIG. 23.

FIG. 15 shows impurity distribution which is perpendicular to the direction of signal charge transfer and passes through the middle of the CCD transfer channel 204 along the depth direction 284 of an n-type semiconductor substrate 1 according to the prior art. A solid line 241 indicates impurity distribution. The reference numeral 242 denotes a peak concentration of the p-type area 283. The reference numeral 243 denotes a thickness of the p-type area 283.

As shown in one-dimensional impurity distribution 241, the p-type area 283 has local distribution at a high concentration. For example, if the dose of boron is 2.0×10$^{12}$ cm$^{-2}$, the peak concentration 242 is about $3.8 \times 10^{16}$ cm$^{-3}$ and the thickness 243 is about 0.7 μm. For this reason, a depleted layer is hindered from expanding from the CCD transfer channel 204 with an increase in voltage of the gate electrode 208 when reading signals. Consequently, it is hard to form a signal reading channel 236 from the photodiode 209 to the CCD transfer channel 204. Thus, the read drive voltage is raised to generate after-image.

There is a problem in that the smear characteristic is considerably deteriorated on a reading side 285. According to the method of the prior art, the CCD transfer channel 204 and the p-type area 283 are formed by separate masks. Consequently, a variation in mask alignment is inevitably caused. For this reason, the read drive voltage, smear and saturation characteristic are fluctuated due to the variation in mask alignment.

SUMMARY OF THE INVENTION

According to the prior art described above, when the area of the vertical CCD n$^+$ area 4 is reduced to make the pixel portion finer, impurity diffusion between the p$^-$ area 16 and p$^+$ area 15 and the vertical CCD n$^+$ area 4, i.e. the impurity diffusion areas 4a and 4b influence the potential of a central portion of the vertical CCD portion (vertical CCD n$^+$ area 4) to drop a depleted voltage and decrease an effective channel volume. As a result, the saturation charge capacity of the vertical CCD portion is lowered so that the amount of transferred charges is decreased in the vertical CCD portion. Furthermore, the read drive voltage, the smear and the saturation characteristic are fluctuated.

In order to solve the above problems, it is an object of the present invention to provide a solid-state image pick-up device having a structure in which the amount of transferred charges is not reduced in the vertical CCD portion even if the pixel portion is made finer, and a method for manufacturing the solid-state image pick-up device.

It is another object of the present invention to provide a solid-state image pick-up device in which a read drive voltage is lowered, smear (stray ray) is reduced and saturation characteristics are excellent, and a method for manufacturing the solid-state image pick-up device.

In order to accomplish the above objects, the present invention provides a first solid-state image pick-up device, comprising a plurality of pixel portions arranged as an array on a semiconductor substrate, each of the pixel portions including a photodiode portion, a vertical transfer portion for reading and transferring charges stored in the photodiode portion, and a control portion for controlling the reading of the charges from the photodiode portion and the transfer of the charges to the vertical transfer portion, whereby the photodiode portion and the vertical transfer portion are arranged like an array on a semiconductor substrate, wherein an isolating portion for isolating the photodiode portion from the vertical transfer portion is formed between adjacent pixel portions, a low-concentration impurity layer doped with impurity atoms having a reverse conductivity type to that of impurity atoms forming the vertical transfer portion is formed in a substrate surface layer including the formation area of the vertical transfer portion and a peripheral area thereof, and a portion of the low-concentration impurity layer which is adjacent to a side of the vertical transfer portion forms the isolating portion, and a portion adjacent to a different side of the vertical transfer portion forms a read control portion.

It is preferred that the impurity atoms forming the vertical transfer portion are selected from the group containing phosphorus and arsenic.

Preferably, the solid-state image pick-up device further comprises a n-type diffusion layer that is selectively formed on the semiconductor substrate surface; and a p-type diffusion layer formed just below the n-type diffusion layer such that at least one end of the p-type diffusion layer is in the same position as an end of the n-type diffusion layer.

It is preferred that the solid-state image pick-up device, further comprises a n-type diffusion layer that is selectively formed on the semiconductor substrate surface; and a p-type diffusion layer that is formed just below the n-type diffusion layer such that both ends of the p-type diffusion layer are in the same positions as corresponding ends of the n-type diffusion layer.

Preferably, the solid-state image pick-up device further comprises a n-type diffusion layer that is selectively formed on the semiconductor substrate surface; and a first p-type diffusion layer formed just below the n-type diffusion layer such that both ends of the first p-type diffusion layer are in the same position as corresponding ends of the n-type diffusion layer, wherein the n-type diffusion layer is enclosed by the first p-type layer and second and third p-type diffusion layers formed on both ends of the n-type diffusion layer.

It is preferred that the solid-state image pick-up device further comprises a n-type diffusion layer that is selectively formed on the semiconductor substrate surface, a p-type diffusion layer that is formed just below the n-type diffusion layer such that at least one end of the p-type diffusion layer is in the same position as an end of the n-type diffusion layer, wherein the n-type diffusion layer includes a photoelectric transfer portion that is formed in a deep portion of a p-type well in the semiconductor substrate.

The present invention provides a second solid-state image pick-up device, comprising a semiconductor substrate; a n-type diffusion layer selectively formed on a surface of the semiconductor substrate; and a first p-type diffusion layer formed just below the n-type diffusion layer on the semiconductor substrate such that at least one end of the p-type diffusion layer is provided in the same position as an end of the n-type diffusion layer.

It is preferred that both ends of the first p-type diffusion layer are provided in substantially the same positions as those of the n-type diffusion layer.

Preferably, the first p-type diffusion layer is formed just below the n-type diffusion layer such that both ends of the first p-type diffusion layer are in the same position as corresponding ends of the n-type diffusion layer, wherein the n-type diffusion layer is enclosed by the first p-type diffusion layer and second and third p-type diffusion layers formed on both ends of the n-type diffusion layer.

It is preferred that the solid-state image pick-up device further comprises an n-type diffusion layer formed as a photoelectric transfer portion in a deep portion of a p-type well in the semiconductor substrate.

Preferably, the solid-state image pick-up device further comprises a vertical transfer portion formed with impurity atoms selected from a group containing phosphorus and arsenic.

The present invention provides a first method for manufacturing a solid-state image pick-up device that includes a plurality of pixel portions arranged as an array on a semiconductor substrate, each of the pixel portions including a photodiode portion, a vertical transfer portion for reading and transferring charges stored in the photodiode portion, a control portion for controlling the reading of charges between the photodiode portion and the vertical transfer portion, and an isolating portion for isolating the photodiode portion from the vertical transfer portion of adjacent pixel portions, the method comprising the steps of forming the vertical transfer portion in a predetermined area of the semiconductor substrate; and implanting impurity atoms having a reverse conductivity type to impurity atoms forming the vertical transfer portion in at least one part of the surface layer of the semiconductor substrate so as to form the insulating portion and a read control portion on side portions of the vertical transfer portion.

It is preferred that ions are implanted into a selective portion on the surface layer of the semiconductor substrate including a formation area of the vertical transfer portion and a peripheral area thereof.

Preferably, ions are implanted into the whole surface layer of the semiconductor substrate including a formation area of the vertical transfer portion and a peripheral area thereof.

It is preferred that the method further comprises the steps of implanting arsenic into a first substrate area of the semiconductor substrate; implanting phosphorus into a second substrate area having a smaller width than that of the first substrate area; and annealing the substrate to form the vertical transfer portion in the predetermined area of the semiconductor substrate.

Preferably, the isolating portion and the read control portion are formed such that a depth from the semiconductor substrate surface is smaller than that of a pn junction of the photodiode portion from the semiconductor substrate surface.

It is preferred that the method further comprises the steps of forming an implantation mask in a predetermined area of the semiconductor substrate; forming a p-type area in the predetermined area by using the implantation mask; and forming a first n-type area on the semiconductor substrate surface using the implantation mask.

Preferably, the method further comprises the steps of forming an implantation mask in a predetermined area of a semiconductor substrate; forming a p-type area in the predetermined area using the implantation mask; forming a first n-type area on the semiconductor substrate surface using the implantation mask; forming a gate insulating film; forming a transfer gate electrode on the gate insulating film on an upper portion of the n-type area; and forming a second n-type area in a predetermined area of the semiconductor substrate.

It is preferred that the first n-type area is a CCD transfer channel and the second n-type area is a photodiode for photoelectric transfer.

Preferably, the method further comprises the steps of implanting ions at an acceleration energy in a range from 100 KeV to 600 KeV to form the p-type area in the predetermined area using the implantation mask; introducing atoms or ions to form the first n-type area on the semiconductor substrate surface using the implantation mask; and introducing atoms or ions to form the second n-type area in the predetermined area of the semiconductor substrate.

It is preferred that the method further comprises the steps of introducing atoms or ions to form the p-type area in the predetermined area using the implantation mask; introducing atoms or ions to form the first n-type area on the semiconductor substrate surface using the implantation mask; and implanting ions at an acceleration energy in a range from 200 KeV to 1.2 MeV to form the second n-type area in the predetermined area of the semiconductor substrate.

Preferably, the implantation mask is formed by exposing a photoresist.

The present invention provides a second method for manufacturing a solid-state image pick-up device, comprising the steps of forming an implantation mask in a predetermined area of a semiconductor substrate; forming a p-type area in a predetermined area using the implantation mask; and forming a first n-type area on a surface of the semiconductor substrate using the implantation mask.

The present invention provides a third method for manufacturing a solid-state image pick-up device, comprising the steps of forming an implantation mask in a predetermined area of a semiconductor substrate; forming a p-type area in the predetermined area using the implantation mask; forming a first n-type area on a surface of the semiconductor substrate using the implantation mask; forming a gate insulating film; forming a transfer gate electrode on the gate insulating film on the upper portion of the n-type area; and forming a second n-type area in the predetermined area of the semiconductor substrate.

It is preferred that the first n-type area is a CCD transfer channel, and the second n-type area is a photodiode for photoelectric transfer.

Preferably, the step of forming the p-type area in the predetermined area using the implantation mask comprises implanting ions at an acceleration energy in a range from 100 KeV to 600 KeV, further comprising the steps of introducing atoms or ions to form the first n-type area on the semiconductor substrate surface using the implantation mask; and introducing atoms or ions to form the second n-type area in the predetermined area of the semiconductor substrate.

It is preferred that the step of forming the p-type area in the predetermined area using the implantation mask comprises implanting atoms or ions, the step of forming the first n-type area on the semiconductor substrate surface side by using the implantation mask comprises introducing atoms or ions, and the step of forming the second n-type area in the predetermined area of the semiconductor substrate comprises implanting ions at an acceleration energy in a range from 200 KeV to 1.2 MeV.

Preferably, the first n-type area is a CCD transfer channel.

It is preferred that the second n-type area is a photodiode for performing photoelectric transfer.

Preferably, the implantation mask is formed by exposing a photoresist.

According to the first solid-state image pick-up device of the present invention described above, the diffusion state of impurities (atoms) in the vertical transfer portion is affected more slightly by the isolating portion for isolating the read control portion for controlling the read of charges and the vertical transfer portion from the photodiode portion. Even if the pixel portion (vertical transfer portion) is made finer, the rapid change of the impurity (atom) concentration is kept in the edge area of the vertical transfer portion. As a result, a drop in depleted voltage and a decrease in effective channel volume can be prevented from occurring by narrow channel effects. Thus, it is possible to prevent the saturation charge capacity in the vertical transfer portion from decreasing.

As a preferred example of the device according to the present invention, the impurity atom forming the vertical transfer portion is phosphorus and arsenic, or only phosphorus so that the transfer efficiency can be enhanced.

The second solid-state image pick-up device of the present invention comprises the n-type diffusion layer that is selectively formed on the semiconductor substrate surface and the p-type diffusion layer that is provided just below the n-type diffusion layer of the semiconductor substrate so as to have respective ends arranged in the same positions as the ends of the n-type diffusion layer. Consequently, the read drive voltage can be dropped, the smear can be reduced and excellent saturation characteristic can be kept.

As a preferred example of the device according to the present invention, the n-type diffusion layer of the vertical transfer portion and the second p-type diffusion layer have respective ends arranged in the substantially same positions so that a variation in manufacture can be prevented from occurring often due to mask alignment errors. Consequently, the device having uniform quality can be manufactured.

According to the first method for manufacturing a solid-state image pick-up device of the present invention, the pixel portion (vertical transfer portion) can be made finer without lowering the saturation charge capacity in the vertical transfer portion. Such a solid-state image pick-up device can be manufactured with the smaller number of masks and steps than in the prior art.

According to the second and third methods for manufacturing a solid-state image pick-up device of the present invention, the number of the manufacturing steps can be further decreased. Thus, the manufacturing efficiency can be enhanced.

As a preferred example of the above method, the first step of implanting arsenic into a first substrate area of the semiconductor substrate, a second step of implanting phosphorus into a second substrate area having a smaller width than that of the first substrate area within the first substrate area, and a step of annealing the substrate are performed so that the vertical transfer portion is formed in the predetermined area of the semiconductor substrate. Consequently, the impurity (atom) concentration in the edge area of the vertical transfer portion is changed more rapidly. Thus, a reduction in the saturation charge capacity in the vertical transfer portion can be prevented more surely from occurring due to the finer pixel portion (vertical transfer portion).

As a preferred example of the above method, the isolating portion and the read control portion are formed so as to have a depth from the semiconductor substrate surface which is smaller than that of a pn junction of the photodiode portion from the semiconductor substrate surface. Consequently, the photodiode portion is not affected by the isolating portion and the read control portion. Thus, the solid-state image pick-up device having excellent device characteristics can be manufactured stably.

As a preferred example of the above method, the method further comprises the steps of forming an implantation mask in the predetermined area of the semiconductor substrate, forming a p-type area in a predetermined area by using the implantation mask, and forming a first n-type area on the semiconductor substrate surface side by using the implantation mask. Consequently, the fluctuation of characteristics can be prevented from occurring due to a variation in implantation mask alignment in the manufacturing steps. Furthermore, the manufacturing cost can be reduced.

According to the solid-stage image pick-up device of the present invention, the diffusion stage of impurities (atoms) in the vertical transfer portion is affected more slightly by the isolating portion for isolating the read control portion for controlling the read of charges and the vertical transfer portion from the photodiode portion. Even if the pixel portion (vertical transfer portion) is made finer, the rapid change of the impurity (atom) concentration is kept in the edge area of the vertical transfer portion. Consequently, a drop in depleted voltage and a decrease in effective channel volume can be prevented from occurring due to narrow channel effects. Thus, the saturated charge capacity is not lowered in the vertical transfer portion. Thus, it is possible to obtain the solid-state image pick-up device in which the amount of transferred charges is not reduced in the vertical CCD portion even if the pixel portion is made finer.

According to the present invention, it is possible to manufacture a solid-state image pick-up device having a CCD in which the read drive voltage can be dropped, the smear can be reduced, excellent saturation characteristic can be kept, the fluctuation of these characteristics can be prevented from occurring due to a variation in implantation mask alignment in the manufacturing steps and the manufacturing cost can be reduced easily.

According to the method for manufacturing a solid-state image pick-up device according to the present invention, the solid-state image pick-up device in which the pixel portion (vertical transfer portion) is made finer without lowering the saturated charge capacity in the vertical transfer portion can be manufactured by using a smaller number of masks and steps than in the prior art.

DETAILED DESCRIPTION OF THE PREFERRED EMBODIMENTS

First Example

Figure 1:
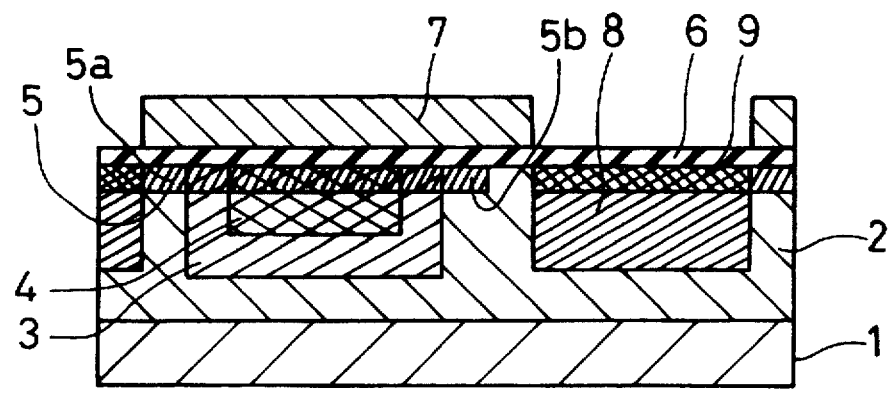
FIG. 1 is a sectional view showing the structure of a photodiode portion and a vertical CCD portion in a pixel portion of a CCD solid-state image pick-up device according to a first example of the present invention.

FIG. 1 is a sectional view showing the structure of a photodiode portion and a vertical CCD portion in a pixel portion of a CCD solid-state image pick-up device according to a first example of the present invention. In FIG. 1, the same reference numerals denote the same or corresponding portions as in FIG. 10. The reference numeral 5 denotes a p⁻ layer for electrically isolating a CCD n⁺ portion 4 and a photodiode n layer 8 and controlling the read of charges from the photodiode n layer 8 to the vertical CCD n⁺ portion 4. The p⁻ layer 5 is formed so as to include a second p-type well 3 and a part of the vertical CCD n⁺ portion 4 in the upper layer part of an N (100) silicon substrate 1. The reference numeral 5a denotes an isolating portion for electrically isolating the vertical CCD n⁺ portion 4 from the photodiode n layer 8 in the p⁻ layer 5. The reference numeral 5b denotes a read control portion for controlling the read of charges from the photodiode n layer 8 to the vertical CCD n⁺ portion 4 in the $p^{31}$ layer 5. As described above, the p⁺ layer 5 is formed so as to include a part of the second p-type well 3. The p⁻ layer 5 may be formed so as not to include the part of the second p-type well 3. FIGS. 2A to 2D are sectional views showing the steps of manufacturing a CCD solid-state image pick-up device according to the present example shown in FIG. 1. In FIGS. 2A to 2D, the same reference numerals denote the same or corresponding portions as in FIG. 1. The manufacturing steps will be described below with reference to FIGS. 2A to 2D.

Figure 2A:
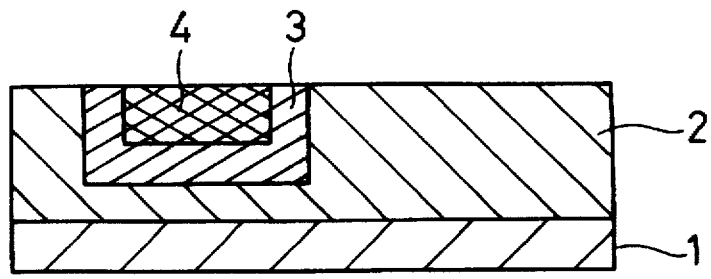
FIGS. 2A to 2D are sectional views showing the steps of manufacturing the CCD solid-state image pick-up device shown in FIG. 1.
Figure 2B:
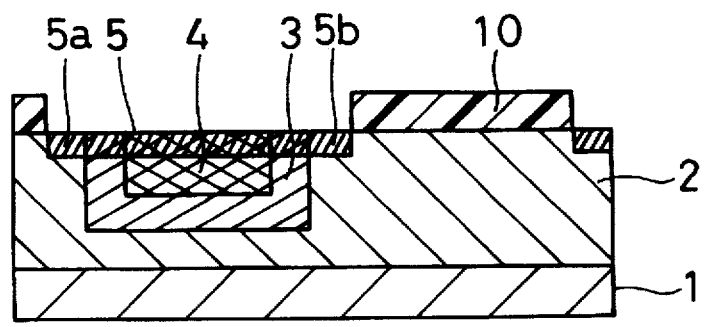
Figure 2C:
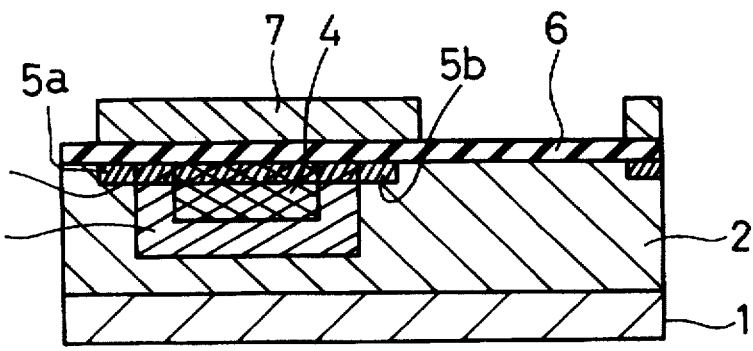
Figure 2D:
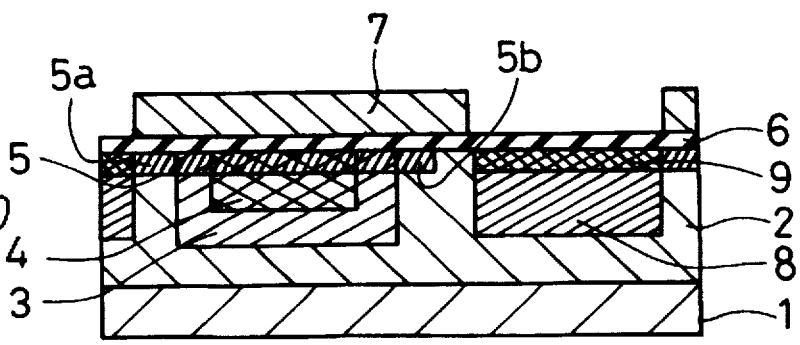

As shown in FIG. 2A, a first p-type well (carrier concentration of $10^{14}$ to $10^{15}$ cm$^{-3}$) 2 and a second p-type well (carrier concentration of $10^{15}$ to $10^{16}$ cm$^{-3}$) 3 were formed on the N (100) silicon substrate 1. Then, a vertical CCD n⁺ region (carrier concentration of $10^{16}$ to $10^{17}$ cm$^{-3}$) 4 was formed in the second p-type well 3. As shown in FIG. 2B, a resist pattern 10 was formed on the surface of the substrate 1. Then, boron was implanted with a dose of about $5 \times 10^{11}$ cm$^{-2}$ in a region which includes the upper layer portion of the second p-type well 3 and the vertical CCD n⁺ portion 4 except for a region in which the photodiode of the substrate 1 should be formed by using the resist pattern 10 as a mask. Thus, a p⁻ layer (carrier concentration of about $10^{16}$ cm$^{-3}$) 5 was formed. As shown in FIG. 2C, a gate insulating film 6 comprising SiO₂ was formed. Then, a polysilicon was deposited on the gate insulating film 6. By using the dry etching method, a read and transfer electrode, i.e. polysilicon electrode 7, was formed. As shown in FIG. 2D, the polysilicon electrode 7 was used as a mask to form an embedded photodiode n layer (carrier concentration of $5 \times 10^{15}$ to $5 \times 10^{16}$ cm$^{-3}$) 8 and an embedded photodiode p⁺ layer (carrier concentration of $10^{17}$ to $10^{20}$ cm$^{-3}$) 9 by ion implantation with self-alignment. Then, a layer insulating film and a photo-shield film (not shown) were formed if necessary. Thus, a CCD solid-state image pick-up device was finished. Since the p⁻ layer 5 is formed by one-time ion implantation, an isolation region having the same carrier concentration as that of a p⁺ layer 15 for isolation of a device according to the prior art cannot be formed. However, if the overlap dimension of the polysilicon electrode 7 and the isolation region is reduced or the distance between the photodiode n layer 8 and the vertical CCD n⁺ layer 4 is increased, the vertical CCD n⁺ layer 4 can be electrically isolated from the photodiode n layer 8. The carrier concentration of each layer is obtained in the state where diffusion is caused by substrate annealing when the device is finished, that is, after impurity atoms are doped.

Figure 7:
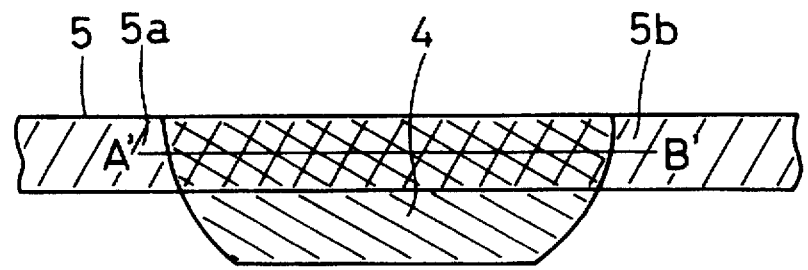
FIG. 7 is a conceptual diagram showing the state of impurity diffusion in a vertical CCD $n^+$ area and the peripheral area thereof in the pixel portion of the CCD solid-state image pick-up device shown in FIG. 1.

The reason why the amount of transferred charges can be inhibited from decreasing in the vertical CCD portion 4 when making the pixel portion finer will be described based on the structure of the CCD solid-state image pick-up device according to the first example. FIG. 7 is a conceptual diagram showing the state where impurities are diffused in the vertical CCD n⁺ area 4 and the peripheral area thereof in the pixel portion of the CCD solid-state image pick-up device according to the present example shown in FIG. 1.

Figure 8:
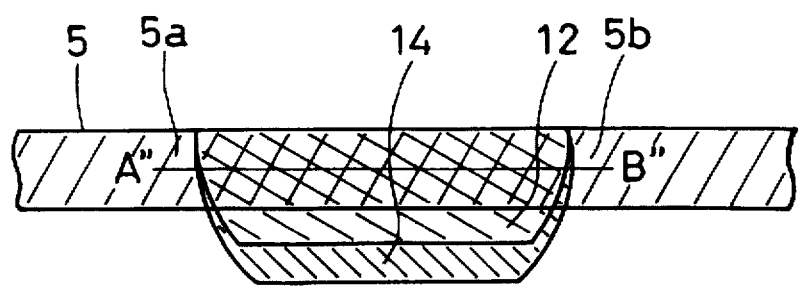
FIG. 8 is a conceptual diagram showing the state of impurity diffusion in a vertical CCD $n^+$ area and the peripheral area thereof in the pixel portion of the CCD solid-state image pick-up device shown in FIG. 5.
Figure 9:
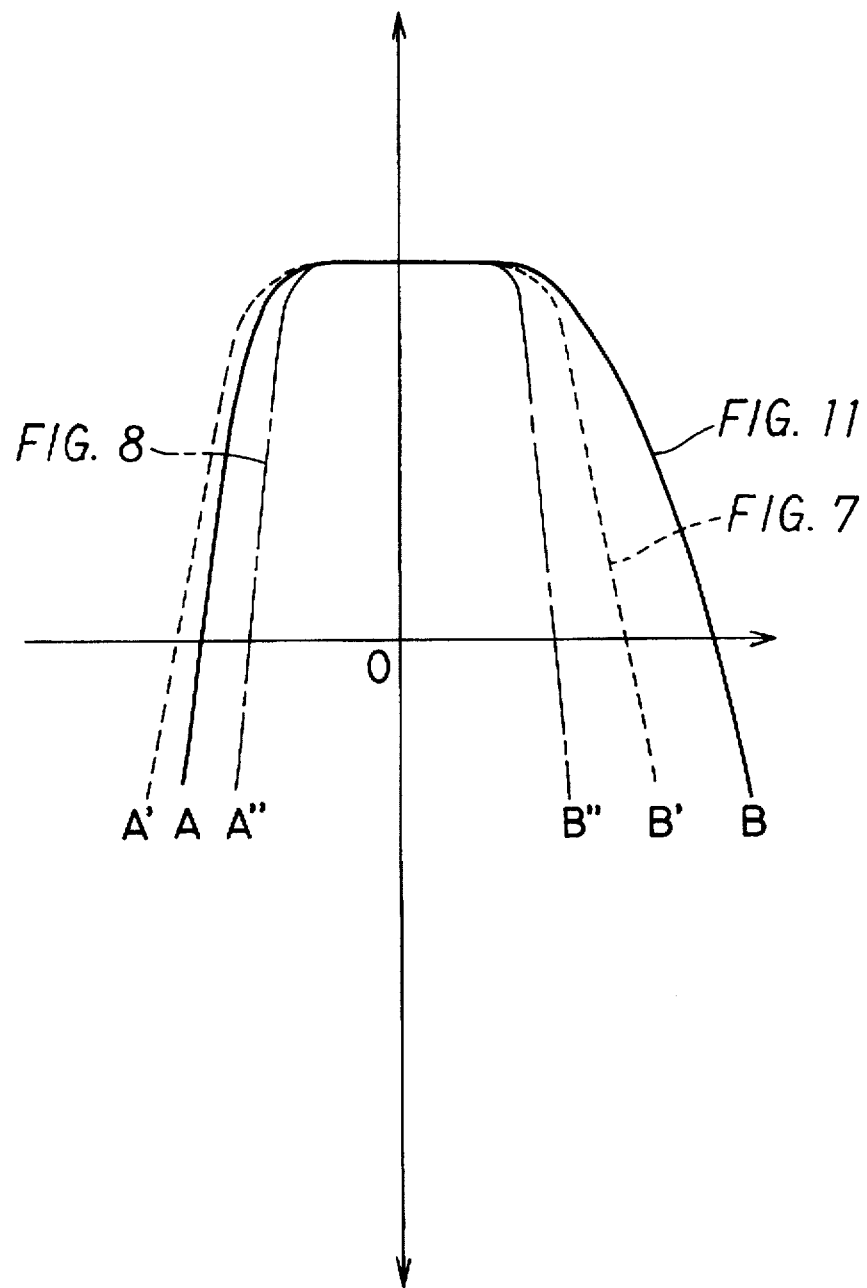
FIG. 9 is a chart showing the distribution of an impurity concentration in the vertical CCD $n^+$ area and the peripheral area thereof in the CCD solid-state image pick-up devices according to the first to third examples of the present invention and the prior art.
Figure 10:
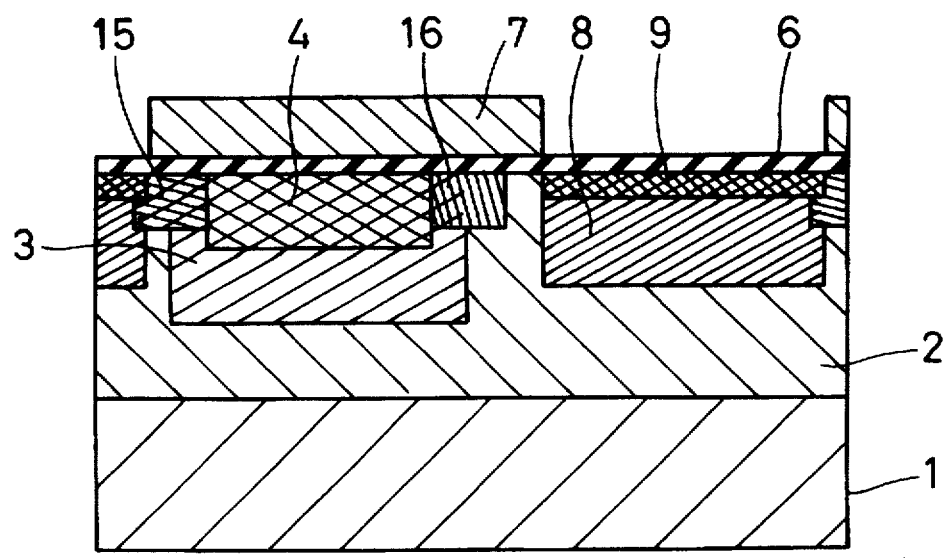
FIG. 10 is a sectional view showing the structure of a photodiode portion and a vertical CCD portion in a pixel portion of the CCD solid-state image pick-up device according to the prior art.
Figure 11:
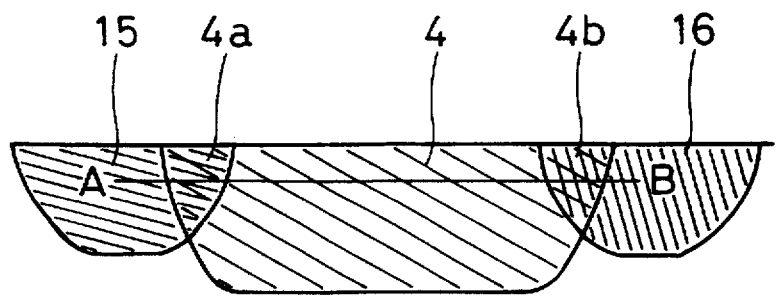
FIG. 11 is a conceptual diagram showing the state of impurity diffusion in a vertical CCD $n^+$ area and the peripheral area thereof in the pixel portion of the CCD solid-state image pick-up device shown in FIG. 10.

FIG. 9 shows the distribution of impurity concentration in the region specified by the line A-B of FIG. 11 of the CCD solid-state image pick-up device according to the prior art shown in FIG. 10. The distribution of impurity concentration of the region specified by the line A'-B' of FIG. 7 of the CCD solid-state image pick-up device according to the first example, and the distribution of impurity concentration of the region specified by the line A"-B" of FIG. 8 of the CCD solid-state image pick-up device according to a third example shown in FIG. 5 which will be described below.

As is apparent from FIG. 9, the change of impurity concentration is very slow in the peripheral portion of the edge region of the vertical CCD portion (vertical CCD n⁺ area 4) in the device according to the prior art (shown by a solid line). In addition, a difference in impurity concentration is made between the isolation region (p⁺ layer 15) and the reading region (p⁻ area 16) so that there is a difference in gradient of the change of impurity concentration in the vicinity of points A and B in FIG. 11.

On the other hand, the impurity concentration is rapidly changed in the peripheral portion of the edge region of the vertical CCD portion (vertical CCD n⁺ area 4) in the device according to the first example (shown by a dotted line in FIG. 9). Ordinarily, the change of the impurity concentration corresponds to that of a potential. In the device according to the prior art, hence, the potential is changed slowly in the edge region of the vertical CCD portion. Consequently, when making the pixel portion finer to form the finer vertical CCD portion (vertical CCD n⁺ area 4), the potential on the center of the vertical CCD portion is affected and the depleted voltage of the vertical CCD portion is dropped and an effective channel volume is reduced due to narrow channel effects. In the device according to the first example, the impurity concentration and the potential are changed rapidly on the periphery of the edge region of the vertical CCD portion. Consequently, in the case where the vertical CCD portion (vertical CCD n⁺ area 4) is formed finer by making the pixel portion finer, the potential on the center of the vertical CCD portion is hardly affected. In other words, the narrow channel effects have smaller influence than in the prior art. Consequently, the depleted voltage of the vertical CCD portion and the effective channel volume can be reduced more than in the structure according to the prior art. In the device of the present example, thus, the amount of transferred charges could be prevented from decreasing in the vertical CCD portion (vertical CCD n⁺ area 4) by making the pixel portion finer.

Second Example

Figure 3:
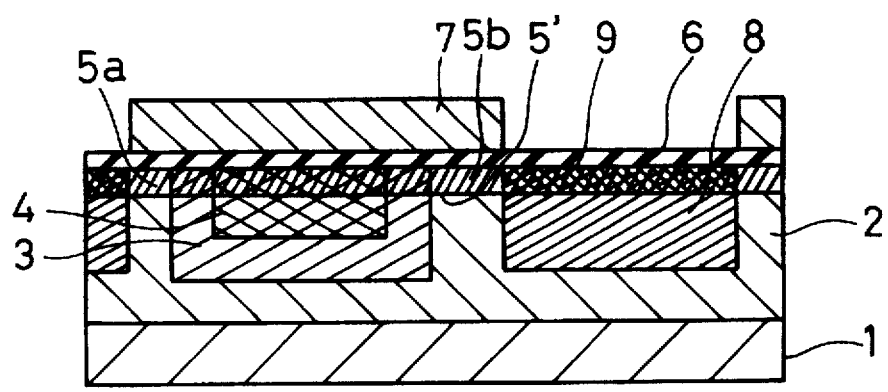
FIG. 3 is a sectional view showing the structure of a photodiode portion and a vertical CCD portion in a pixel portion of a CCD solid-state image pick-up device according to a second example of the present invention.

FIG. 3 is a sectional view showing the structure of a CCD solid-state image pick-up device according to a second example of the present invention. In FIG. 3, the same reference numerals denote the same or corresponding portions as in FIG. 1. The reference numeral 5' denotes a p⁻ layer for electrically isolating a CCD n⁺ portion 4 from a photodiode n⁺ layer 8 and controlling the read of charges from the photodiode n⁺ layer 8 to the vertical CCD n⁺ portion 4. In the solid-state image pick-up device according to the second example, the p⁻ layer 5' is formed by implanting boron ions over a wafer N (100) silicon substrate 1.

FIGS. 4A to 4D are sectional views showing the steps of manufacturing a CCD solid-state image pick-up device according to the second example shown in FIG. 3. In FIGS. 4A to 4D, the same reference numerals denote the same or corresponding portions as in FIG. 3. The manufacturing steps will be described below with reference to FIGS. 4A to 4D.

Figure 4A:
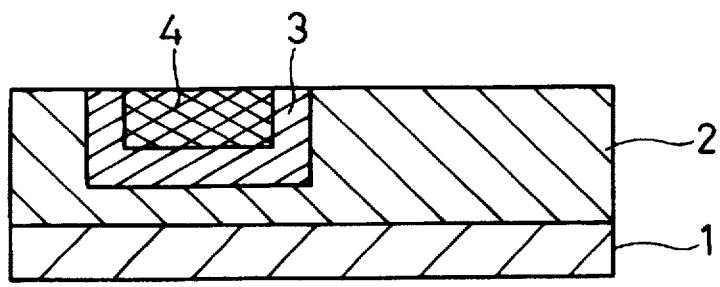
FIGS. 4A to 4D are sectional views showing the steps of manufacturing the CCD solid-state image pick-up device shown in FIG. 3.
Figure 4B:
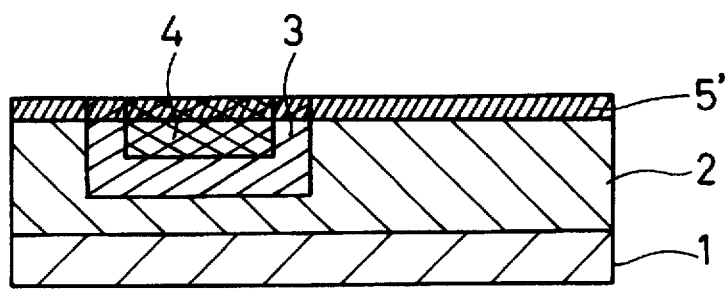
Figure 4C:
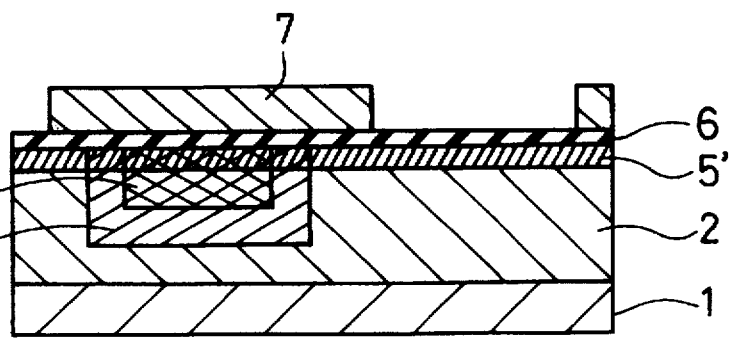
Figure 4D:
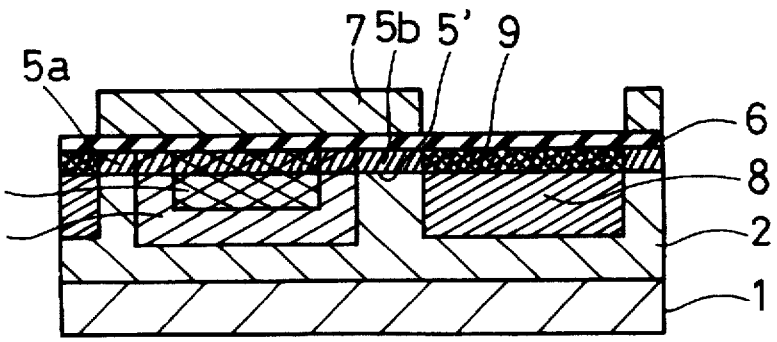

As shown in FIG. 4A, a first p-type well 2 and a second p-type well 3 were formed on the N(100) silicon substrate 1 in the same manner as in the first example. Then, a vertical CCD n⁺ portion 4 was formed in the second p-type well 3. Thereafter, boron ions were implanted with a dose of about 5×10¹¹ cm⁻² over the N(100) silicon substrate 1 to form the p⁻ layer 5' as shown in FIG. 4B. As shown in FIG. 4C, a gate insulating film 6 comprising SiO₂ was formed. Then, a polysilicon was deposited on the gate insulating film 6. By using the dry etching method, a read and transfer electrode, i.e. polysilicon electrode 7, was formed. As shown in FIG. 4D, the polysilicon electrode 7 was used as a mask to form an embedded photodiode n layer 8 and an embedded photodiode p⁺ layer 9 by ion implantation with self-alignment. Then, a layer insulating film and a photo-shield film (not shown) were formed if necessary. Thus, a CCD solid-state image pick-up device was finished. At the step of implanting ions during the formation of the p⁻ layer 5', acceleration energy was set in such a manner that the p⁻ layer 5' is taken into the embedded photodiode p⁺ layer 9 when terminating the step of forming the device (FIG. 4D). If the acceleration energy was set at the step of implanting ions during the formation of the p⁻ layer 5' in such a manner that the p⁻ layer 5' was formed in a deeper position than the embedded photodiode p⁺ layer 9, the dose of impurity atoms was increased when forming the embedded photodiode n layer 8. Thus, the p⁻ layer 5' layer had no influence on the photodiode portion.

According to the second example, the p⁻ layer 5' was not selectively formed but over the N (100) silicon substrate 1. The p⁻ layer 5' serves to electrically isolate the vertical CCD n⁺ portion 4 from the photodiode n layer 8 and to control the read of charges from the photodiode n layer 8 to the vertical CCD n⁺ portion 4. Consequently, it was not necessary to form a resist mask (resist pattern 10) described in the first example. Thus, the manufacturing steps could be simplified more than in the first example.

Third Example

Figure 5:
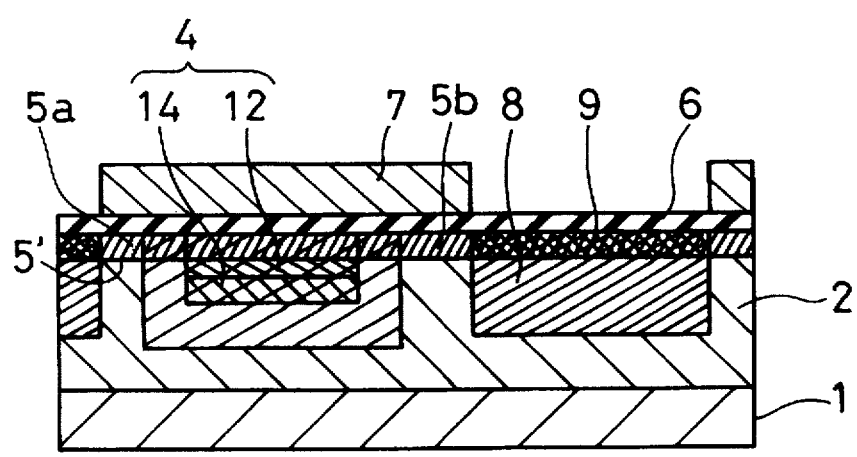
FIG. 5 is a sectional view showing the structure of a photodiode portion and a vertical CCD portion in a pixel portion of a CCD solid-state image pick-up device according to a third example of the present invention.

FIG. 5 is a sectional view showing the structure of a CCD solid-state image pick-up device according to a third example of the present invention. In FIG. 5, the same reference numerals denote the same or corresponding portions as in FIG. 3. The reference numeral 12 denotes a vertical CCD arsenic implanting layer, and the reference numeral 14 denotes a vertical CCD phosphorus implanting layer. FIGS. 6A to 6D are sectional views showing the steps of manufacturing the CCD solid-state image pick-up device according to the third example shown in FIG. 5. In FIGS. 6A to 6D, the same or corresponding reference numerals denote the same portions as in FIG. 5. The reference numerals 11 and 13 denote resist patterns. The manufacturing steps will be described below with reference to FIGS. 6A to 6D.

Figure 6A:
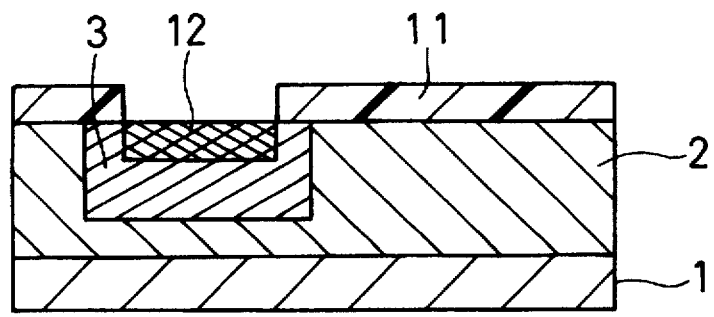
FIGS. 6A to 6D are sectional views showing the steps of manufacturing the CCD solid-state image pick-up device shown in FIG. 5.
Figure 6B:
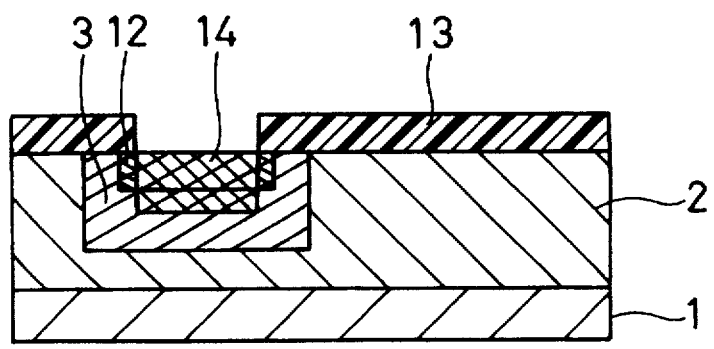
Figure 6C:
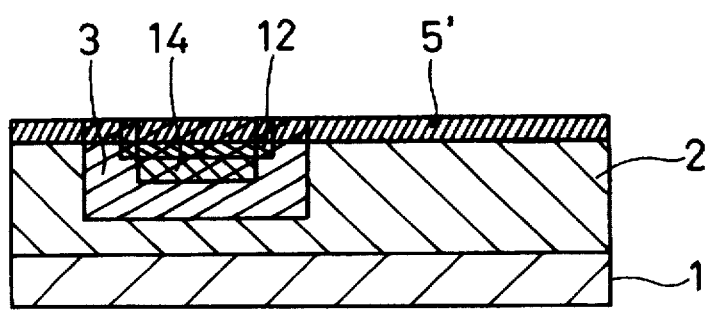
Figure 6D:
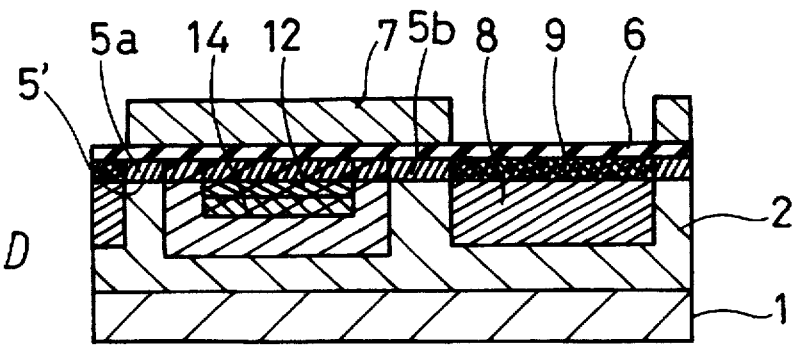

As shown in FIG. 6A, a first p-type well 2 and a second p-type well 3 were formed on an N (100) silicon substrate 1. Then, a resist pattern 11 was formed on the surface of the substrate 1. By using the resist pattern 11 as a mask, arsenic atoms were implanted in the second p-type well 3. Thus, the vertical CCD arsenic implanting layer 12 as one of the components of the vertical CCD n⁺ layer 4 was formed. After the resist pattern 11 was removed, a resist pattern 13 was newly formed on the surface of the substrate 1 as shown in FIG. 6B. By using the resist pattern 13 as a mask, phosphorus atoms were implanted into the arsenic implanting layer 12. Thus, the vertical CCD phosphorus implanting layer 14 as the other component of the vertical CCD n⁺ layer 4 was formed. As shown in FIG. 6C, boron ions were implanted with a dose of 5×10¹¹ cm⁻² over the substrate 1 to form the p⁻ region 5'. As shown in FIG. 6D, a gate insulating film 6 comprising SiO₂ was formed. Then, a polysilicon was deposited on the gate insulating film 6. By using the dry etching method, a read and transfer electrode, i.e. a polysilicon electrode 7, was formed. Thereafter, the polysilicon electrode 7 was used as a mask to form an embedded photodiode n layer 8 and an embedded photodiode p+ layer 9 by ion implantation with self-alignment. Furthermore, a layer insulating film and a photo-shield film (not shown) can be formed if necessary. Thus, a CCD solid-state image pick-up device was finished. At the beginning of ion implantation of the above steps, the vertical CCD phosphorus implanting layer 14 was formed in the vertical CCD arsenic implanting layer 12. When terminating the step of manufacturing the device (FIG. 6C), that is, after substrate annealing, an implantation region for the beginning of the implantation was set in such a manner that the edge of the vertical CCD phosphorus implanting layer 14 overlaps with that of the vertical CCD arsenic implanting layer 12. At the step of implanting ions during the formation of the p⁻ layer 5', acceleration energy was set in such a manner that the p⁻ layer 5' is taken into the embedded photodiode p+ layer 9 when terminating the step of manufacturing the device (FIG. 6D) in the same manner as in the second example. If the acceleration energy was set at the step of implanting ions during the formation of the p⁻ layer 5' in such a manner that the p⁻ layer 5' was formed in a deeper position than the embedded photodiode p+ layer 9, the dose of impurity atoms was increased when forming the embedded photodiode n layer 8. Thus, the p⁻ layer 5' layer has no influence on the photodiode portion.

The reason why a reduction in amount of transferred charges in the vertical CCD portion can be prevented when making the pixel portion finer based on the structure of the solid-state image pick-up device according to the third example will be described below. FIG. 8 is a conceptual diagram showing the state in which impurities are diffused in the vertical CCD n+ area 4 (the vertical CCD phosphorus implanting layer 14 and the vertical CCD arsenic implanting layer 12) and the peripheral region thereof in the pixel portion of the CCD solid-state image pick-up device according to the third example. In the device, the potential of the edge area of the vertical CCD portion is changed rapidly by the same functions as in the first and second examples. Consequently, the reduction in amount of transferred charges can be prevented without reducing the depleted voltage of the vertical CCD portion and decreasing the effective channel volume. Furthermore, high transfer efficiency can be obtained. The vertical CCD n+ area 4 is formed in such a manner that the area into which phosphorous atoms having a greater coefficient of thermal diffusion than that of the arsenic atoms are implanted (vertical CCD phosphorus implanting layer 14) is smaller than the area into which the arsenic atoms are implanted (vertical CCD arsenic implanting layer 12) and their edges overlap each other in the same position after substrate annealing. Accordingly, the vertical CCD n+ area 4 is formed by using the arsenic and phosphorus atoms as impurities of the edge thereof. In other words, the arsenic and phosphorus atoms are implanted into the same substrate region without taking a difference in coefficient of thermal diffusion between the arsenic and phosphorus atoms into consideration so that the vertical CCD n+ area 4 is formed. The vertical CCD n+ area 4 can be held higher than in the devices of the first and second examples. Accordingly, the impurity concentration of the peripheral portion of the vertical CCD portion edge area is changed more rapidly. Therefore, it is possible to prevent a reduction in depleted voltage and a decrease in effective channel volume of the vertical CCD portion at a higher level than in the devices of the first and second examples. Furthermore, a reduction in saturated charge capacity of the vertical transfer portion can be prevented more surely from occurring due to the finer pixel portion (vertical transfer portion).

While boron has been used as a p-type impurity atom during the formation of the p⁻ layers 5 and 5' in the first to third examples, it is needless to say that other p-type impurity atoms such as aluminum or gallium can be used in the present invention.

In the first to third examples, the vertical CCD portion was formed and the p⁻ layers 5 and 5' were then formed. In the present invention, the same effects can be obtained even if the vertical CCD portion and the p⁻ layers 5 and 5' are formed in the reverse order.

While the vertical CCD portion and the p⁻ layers 5 and 5' have been formed by ion implantation before forming the gate insulating film in the examples 1 to 3, the same effects can be obtained even if they are formed after forming the gate insulating film.

While the solid-stage image pick-up device in which the vertical CCD area is formed by the n+ area by using the n-type semiconductor substrate has been described in the first to third examples, it is needless to say that the present invention can be applied to a solid-state image pick-up device having a reverse conductivity type to that of the solid-state image pick-up device using the p-type semiconductor substrate described in the first and third examples.

Fourth Example

Figure 12:
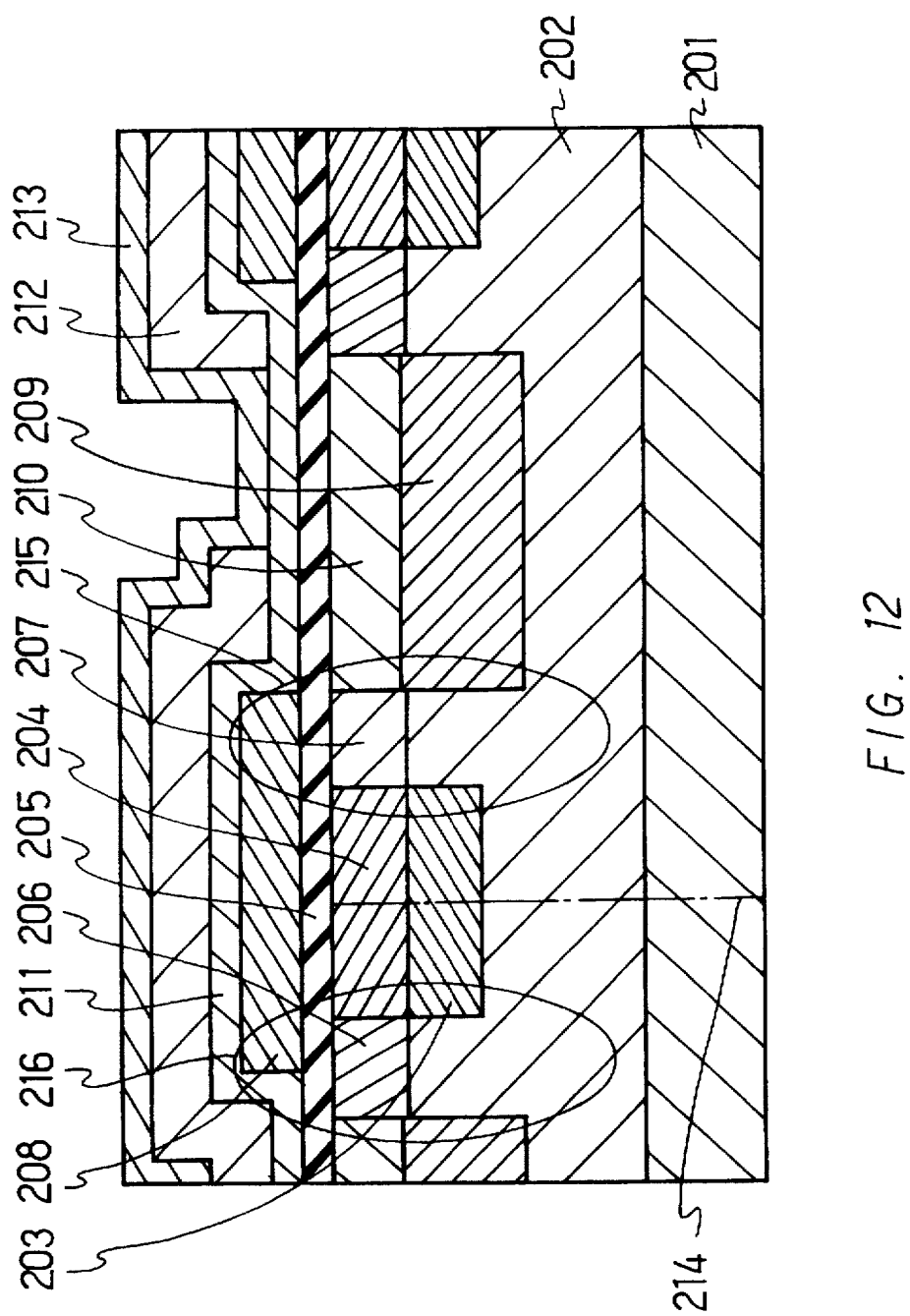
FIG. 12 is a diagram typically showing the sectional structure of the pixel portion of the CCD solid-state image pick-up device according to a fourth example of the present invention.

FIG. 12 is a sectional view typically showing a pixel portion of a CCD solid-state image pick-up device according to an embodiment of the present invention. In FIG. 12, a p-type well 202 having a low concentration is formed on an n-type semiconductor substrate 201. The p-type well 202 has a concentration of about $1 \times 10^{16}$ cm$^{-3}$ or less in order to control blooming. By setting the concentration to such a value, a voltage to be applied to the n-type semiconductor substrate 201 can be set to 15 V or less and a vertical voltage can be set to 20 V or less during electronic shutter. A n-type photodiode area 209 is selectively formed in the deep portion of the p-type well 202. In order to eliminate a dark current, a high concentration p-type area 210 is selectively formed on the surface of the n-type semiconductor substrate 201 on the upper portion of the n-type photodiode area 209. A CCD transfer channel in a n-type area 204 is selectively formed on the surface of the n-type semiconductor substrate 201 of the p-type well 202. A p-type area 206 is selectively formed, for isolation on the surface portion of the p-type well 202, so as to connect the photodiode n-type area 209 and the n-type area 204. The region in which the p-type area 206 is formed in contact with the n-type area 204 is the signal charge non-reading side. A signal charge non-reading side area is shown by a solid line area 216. A p-type area 207 is selectively formed for isolation and read drive voltage control on the surface portion of the p-type well 202. The p-type area 207 is in contact with the n-type area 204 on the edge which is not in contact with the p-type area 206 so as to connect the n-type area 204 to the n-type area 209. The region in which the p-type area 207 is formed in contact with the n-type area 204 is the signal charge reading side. A signal charge reading side area is shown by a solid line area 215. The p-type area 203 is provided just below the n-type area 204 of the CCD transfer channel inside the p-type well 202, and has both ends positioned on both ends of the n-type area 204 in such a manner that the p-type areas 206 and 207 enclose the n-type area 204. The p-type area 203 isolates the n-type CCD transfer channel 204 from the n-type semiconductor substrate 201. In addition, the p-type area 203 increases the thickness of a signal reading channel by setting both ends to the same positions as both ends of the n-type area 204 so as to reduce the read drive voltage. Smear charges which have been sucked into the CCD transfer channel by enlarging the depleted layer over the photodiode and the substrate area are flown into the photodiode and the substrate. Thus, the smear characteristics can be enhanced. A gate insulating film 205, for surface coating, is formed on the surface of the n-type semiconductor substrate 201. A gate electrode 208 is formed in a predetermined region on the gate insulating film 205. Furthermore, an insulating film 211 is formed over the substrate 201. A photo-shield film 212 is provided on the insulating film 211 in order to prevent smear from occurring due to incident light on other regions than the photodiode. As the photo-shield film 212, an Al film, a Ti film which is a high melting point metal having excellent photo-shield properties, a WSi film and a W film can be used. A protection film 213 is formed over the whole face of the photo-shield film 212. The reference numeral 214 denotes the direction of the depth of the n-type semiconductor substrate 201 which is perpendicular to the direction of signal charge transfer and passes through the middle of the CCD transfer channel.

The principle of enhancement of characteristics of the CCD solid-state image pick-up device having the above structure will be described below.

Figure 14:
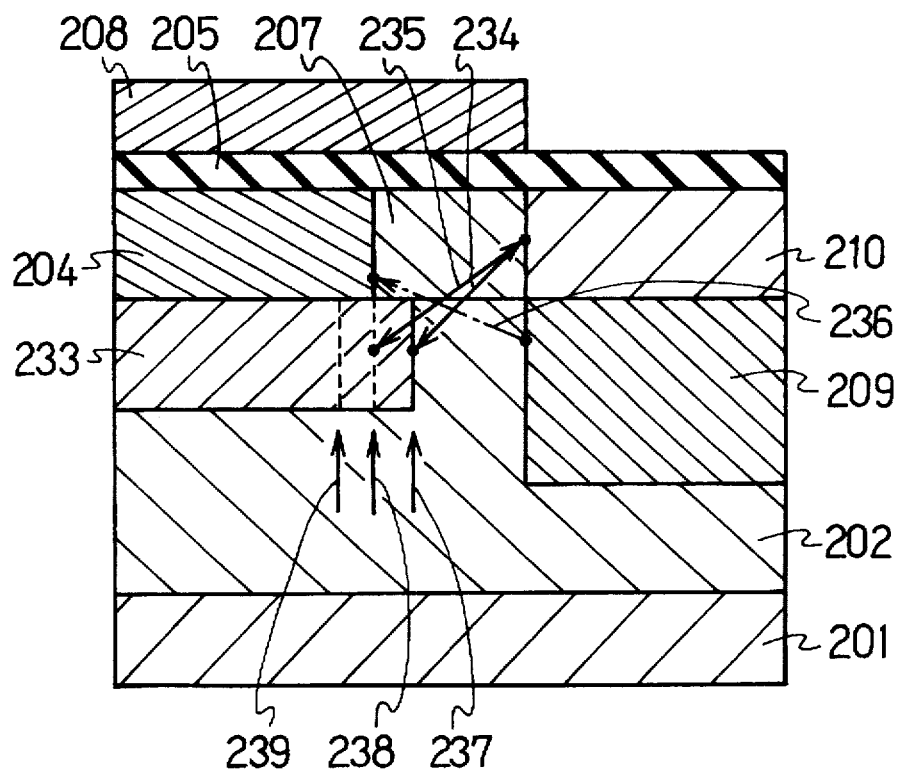
FIG. 14 is an enlarged sectional view of the prior art for comparing the operation of a signal reading side area between the fourth example of the present invention and the prior art.
Figure 15:
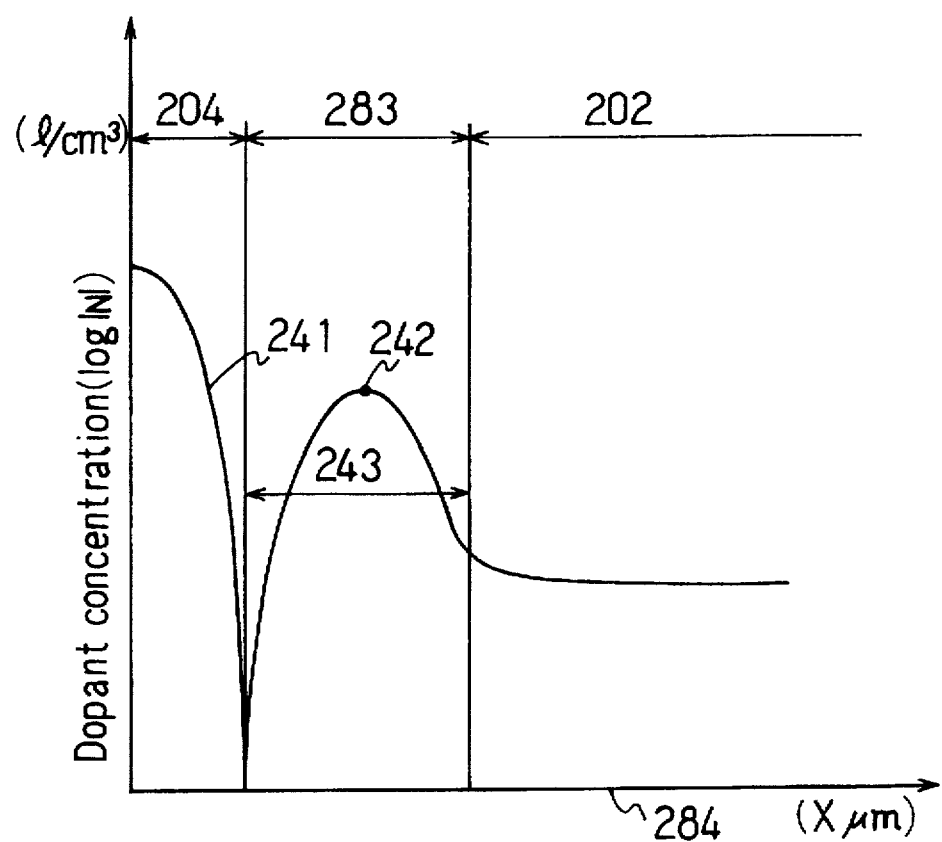
FIG. 15 is a chart showing impurity distribution that is perpendicular to the direction of signal charge transfer and passes through the middle of a CCD transfer channel along the direction of the depth of an n-type semiconductor substrate.
Figure 23:
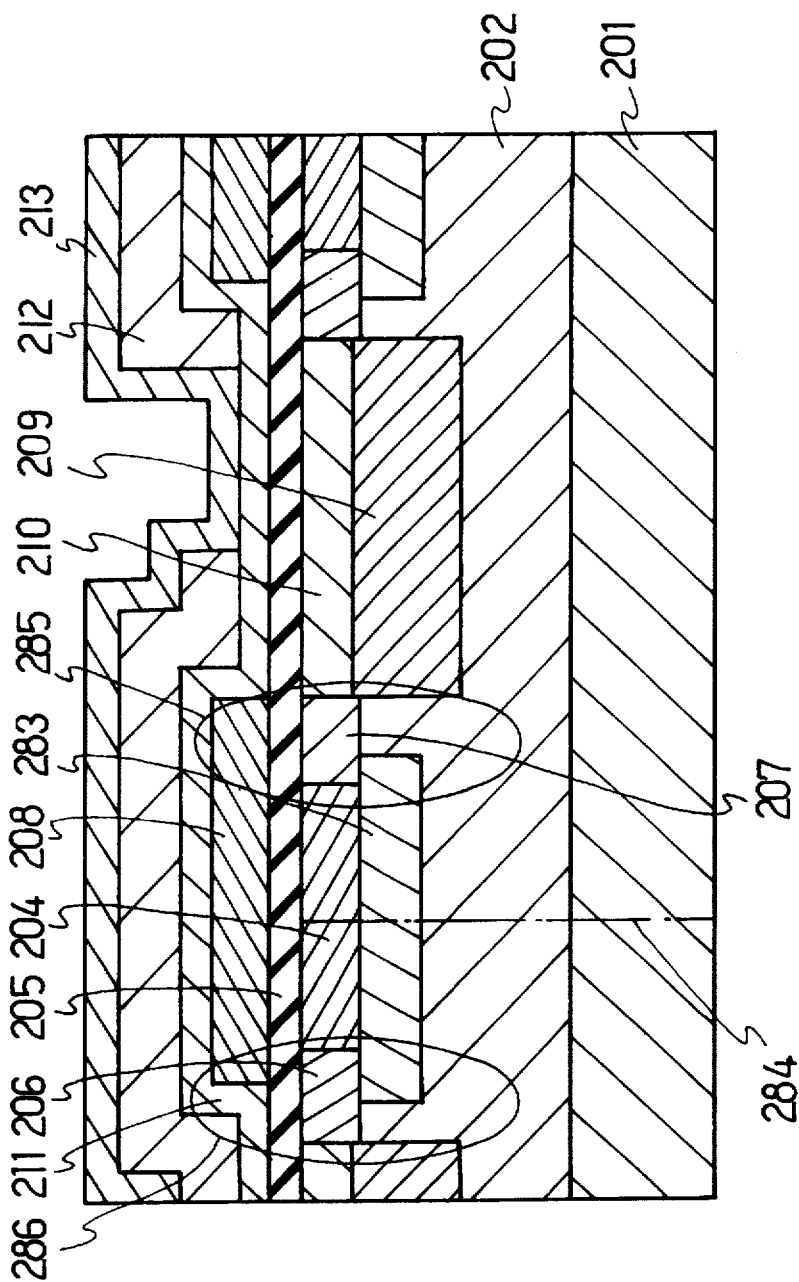
FIG. 23 is a sectional view typically showing the structure of a pixel portion of a CCD solid-state image pick-up device according to another prior art.

First of all, the reduction in read drive voltage caused by the signal reading side area and the maintenance of saturation characteristics will be described with reference to FIG. 14. FIG. 14 is an enlarged sectional view showing the signal reading side 215 according to the fourth example. The reference numeral 233 denotes a p-type area provided just below the CCD transfer channel 204. The reference numerals 239, 238 and 237 denote positions on the end of the p-type area 233, respectively. For example, if the end of the p-type area 233 of the signal reading side area is on the position 238, the area 233 is the same as the p-type area 203 in the fourth embodiment. If the end of the p-type area 233 of the signal reading side area is on the position 237, the area 233 is the same as the p-type area according to the prior art (FIG. 23). A dotted line 236 drawn from the photodiode 209 to the CCD transfer channel 204 is a signal reading channel. A solid line 234 indicates the thickness of a signal reading channel according to the prior art. A solid line 235 indicates the thickness of a signal reading channel according to the fourth example. A voltage of 0 V is applied to the high concentration p-type area 210 and the p-type area 233. For convenience of explanation, the thickness of the signal reading channel 236 during formation is typically shown so as to connect the midpoints of the n-type semiconductor substrate 201 in the high concentration p-type area 210 and the p-type area 233 in the direction of depth. The areas denoted by other reference numerals in FIG. 14 are the same as in FIG. 12.

When reading a signal, the signal reading channel 236 is formed from the photodiode 209 to the CCD transfer channel 204. A signal reading efficiency related to the read drive voltage is expressed by the following equation.

Signal reading efficiency ∝ 1/[(channel length) ×

(channel width) × (channel thickness)]

If the end of the p-type area 233 is on the position 237, the signal charge reading channel 236 is formed on the solid lines 234 to make a thickness. If the end of the p-type area 233 is on the position 238 (in the same way as the p-type area 203 of the fourth example), the channel thickness is shown by a solid line 235. In consideration of the Pythagorean theorem, the channel thickness is enlarged from the solid line 234 to the solid line 235 by moving the end of the p-type area 233 from the position 237 to the position 238. Consequently, the signal reading efficiency can be enhanced and the read drive voltage can be reduced. When the end of the p-type area 233 is moved to the position 239, the channel thickness is increased as described above. In addition, the read drive voltage can be reduced. On the other hand, the CCD transfer channel 204 cannot be enclosed by the p-type area 207 and the p-type area 233. Consequently, the CCD transfer channel 204 cannot be isolated from the n-type semiconductor substrate 201. Thus, the malfunction of the CCD is caused.

When the end of the p-type area 233 is moved from position 237 to position 238 (in the same way as the p-type area 203 of the fourth example), the isolation of the CCD transfer channel 204 from the photodiode 209 becomes poor before reading. As a result, punch through is easily caused. However, the punch through can be prevented to maintain high device saturation by adjusting the width of the p-type area 207 and the distance between the CCD transfer channel 204 and the photodiode 209 on the signal reading side 215. Since the concentration of the p-type area 207 is not changed, the read drive voltage is not increased.

The reduction in smear caused by the signal non-reading side area and the maintenance of saturation characteristics will be described with reference to FIGS. 16, 17 and 18 and Table 1.

Figure 16:
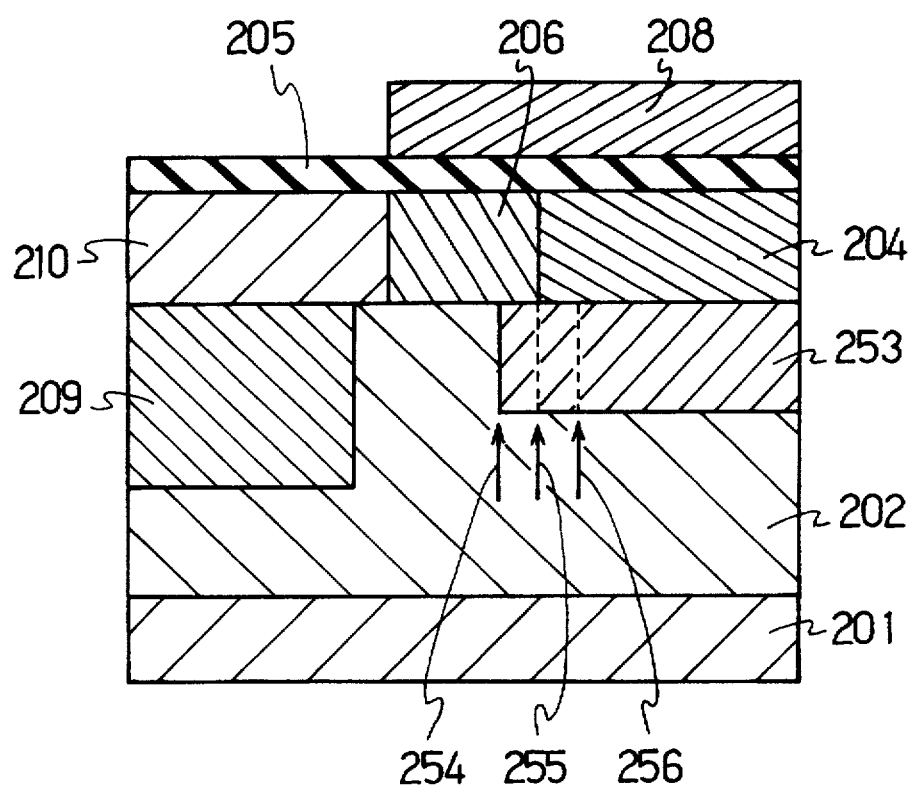
FIG. 16 is an enlarged sectional view for comparing a non-reading side area between the fourth example of the present invention and the prior art.

FIG. 16 is an enlarged sectional view showing the signal non-reading side area 216 according to the fourth example. The reference numeral 253 denotes a p-type area provided just below the CCD transfer channel 204. The reference numerals 254, 255 and 256 denote positions on the end of the p-type area 253 respectively. For example, if the end of the p-type area 253 of the signal non-reading side area is on position 255, the p-type area 253 is the same as the p-type area 203 in the fourth embodiment. If the end of the p-type area 253 of the signal non-reading side area is on position 254, the p-type area 253 is the same as the p-type area according to the prior art (FIG. 23). FIGS. 17 and 18 typically show potential distribution and a smear diffusion current obtained by a three-dimensional optical device simulation according to the prior art and the fourth example in the non-reading side area. By using a three-dimensional optical device simulator, transient analysis is performed on potential, electrons and holes with electrons-pairs of holes successively generated by incident light. Thus, signal charges stored in the photodiode 209 and smear charges stored in the CCD transfer channel 204 can be obtained.

Figure 17:
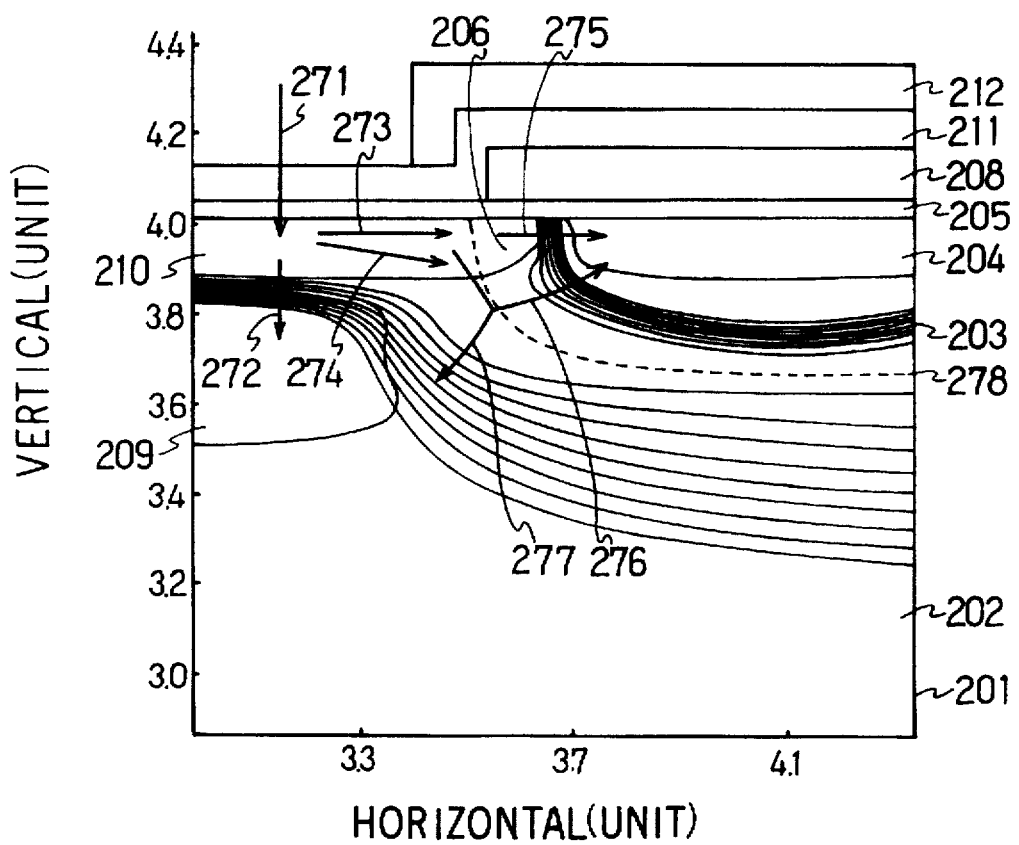
FIG. 17 is a typical view showing a smear diffusion current and potential distribution obtained by a three-dimensional optical device simulation of the prior example in the non-reading side area according to the prior art.

In FIG. 17, an arrow 271 denotes incident light. Arrows 272, 273 and 274 denote electron currents generated by the incident light 271 and diffused radially. Arrows 275 and 276 denote smear electron currents sucked into the CCD transfer channel 204. An arrow 277 denotes an electron current sucked in the direction of the depths of the photodiode 209 and the n-type semiconductor substrate 201. A broken line 278 denotes a smear charge capture area of the CCD transfer channel 204. The smear charge capture area 278 corresponds to the crest of peripheral potential of the CCD transfer channel 204 and is formed in a region which almost divides the photodiode 209 and the CCD transfer channel 204 in two parts.

Table 1 shows smear vales of the reading and non-reading sides and the whole device obtained by the three-dimensional optical device simulation according to the examples of the present invention and the prior art.

TABLE 1

|  | Reading side | Non-reading side | Whole device |
|---|---|---|---|
| Prior art | 0.020% | 0.0768% | 0.0968% |
| Examples of the present invention | 0.020% | 0.0545% | 0.0745% |

In FIG. 16, when the end of the p-type area 253 is moved from position 254 to position 255, impurity diffusion from the p-type area 253 becomes poorer so that the p-type impurity concentration is reduced on the lower portion of the p-type area 206. For this reason, when the photodiode 209 approaches the CCD transfer chanel 204 on the non-reading side 216 (FIG. 12), the effective distance between the CCD transfer channel 204 and the photodiode 209 is reduced as shown in FIG. 18. As compared with the prior art shown in FIG. 17, the crest of the potential on the periphery of the CCD transfer channel 204 also approaches the CCD transfer channel 204 still more according to the result of the fourth example shown in FIG. 8. Consequently, the smear charge capture area 278 can be reduced more in the fourth example than in the prior art. Furthermore, the effective distance between the CCD transfer channel 204 and the photodiode 209 is reduced. Consequently, the p-type area 203 on the lower portion of the p-type area 206 starts to be depleted unlike the prior art shown in FIG. 17. Thus, a potential gradient can be formed in the direction of the depths of the photodiode 209 and the n-type semiconductor substrate 201, wherein position 270 acts as a boundary.

From the foregoing description, most of the electron current 274 which is generated by the incident light 271 and radially diffused is changed to the electron current 277 which flows in the direction of the deep portions of the photodiode 209 and the n-type semiconductor substrate 201. The smear electron current 276 sucked into the CCD transfer channel 204 can be reduced to about ⅙ as compared with the prior art shown in FIG. 17. The smear of the whole device can be reduced by about 23% as seen in the results of Table 1. When the end of the p-type area 253 is moved to position 256, the smear capture area of the CCD transfer channel 204 can be reduced as described above. Thus, the smear can be reduced. However, the CCD transfer channel 204 cannot be enclosed by the p-type areas 206 and 253. For this reason, the CCD transfer channel 204 cannot be isolated from the n-type semiconductor substrate 201 so that malfunction of the CCD is caused.

Figure 18:
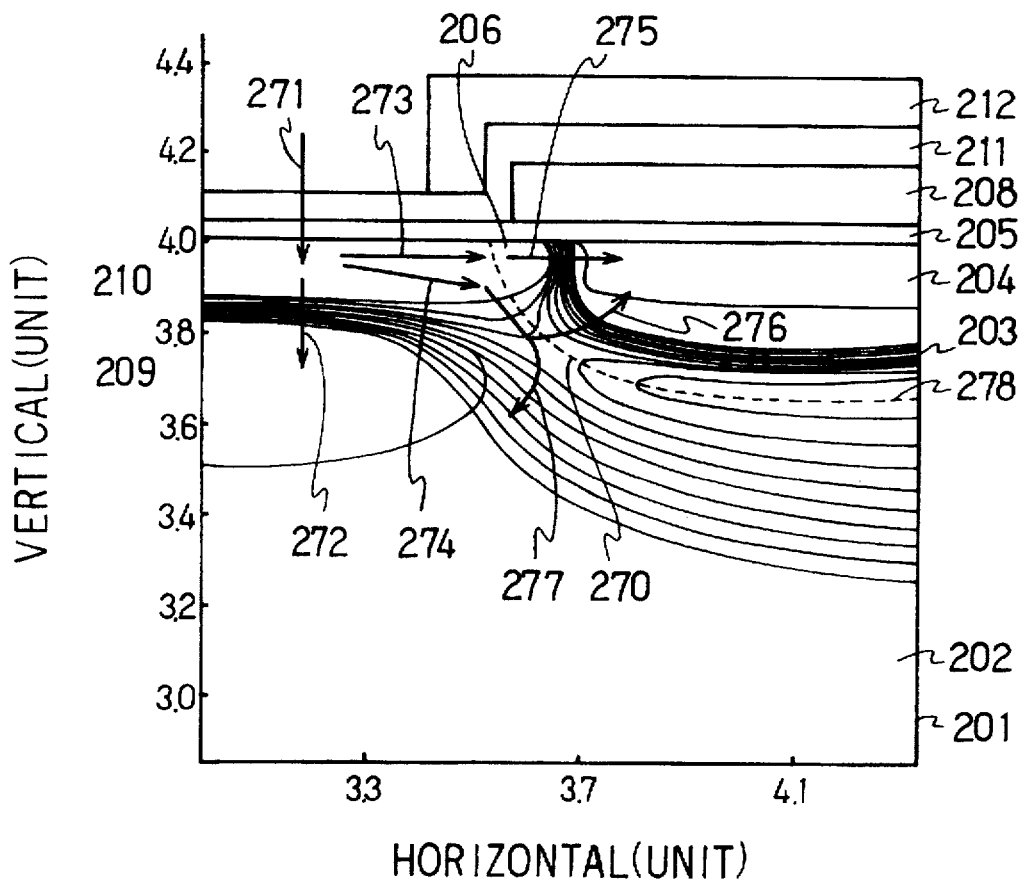
FIG. 18 is a typical view showing a smear diffusion current and potential distribution obtained by a three-dimensional optical device simulation in the non-reading side area according to the fourth example of the present invention.

According to the simulation result shown in FIG. 18, the potential on the position 270 is −0.2 V. Hence, punch through is not caused and saturation characteristic is not deteriorated. In the case where the punch through is easily caused, the concentration of the p-type area 206 and the distance between the CCD transfer channel 204 and the photodiode 209 on the signal non-reading side 216 are adjusted so as to prevent the punch through from occurring and to keep device saturation high.

According to the fourth example, the n-type diffusion layer is selectively formed on the surface of the semiconductor substrate, and the p-type diffusion layer is provided just under the n-type diffusion layer of the semiconductor substrate and has both ends formed in the same positions as both ends of the n-type diffusion layer. Therefore, the read drive voltage can be dropped, the smear can be reduced and excellent saturation characteristic can be kept.

Fifth Example

FIGS. 13A to 13E are sectional views typically showing the steps of manufacturing a CCD solid-state image pick-up device according to the fifth example of the present invention.

Figure 13A:
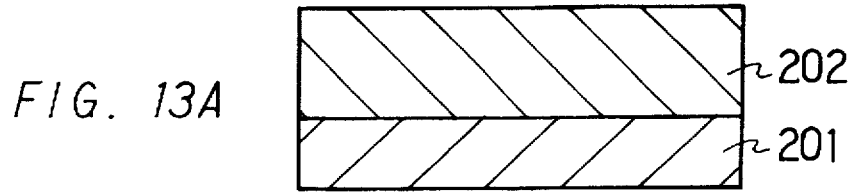
FIGS. 13A to 13E are sectional views typically showing the steps of manufacturing the CCD solid-state image pick-up device according to a fifth example of the present invention.
Figure 13B:
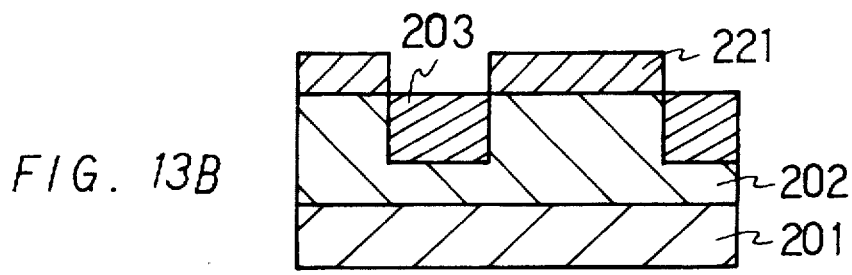
Figure 13C:
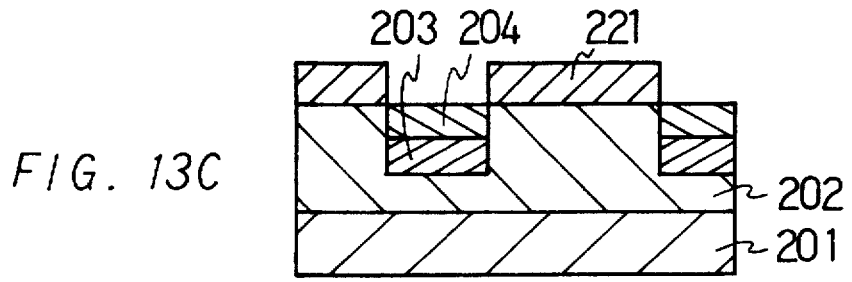
Figure 13D:
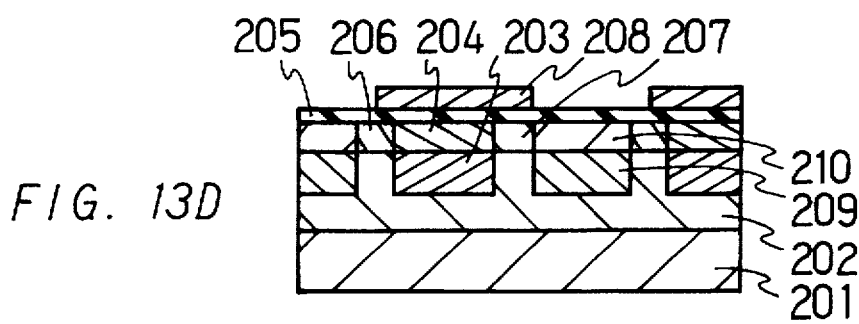
Figure 13E:
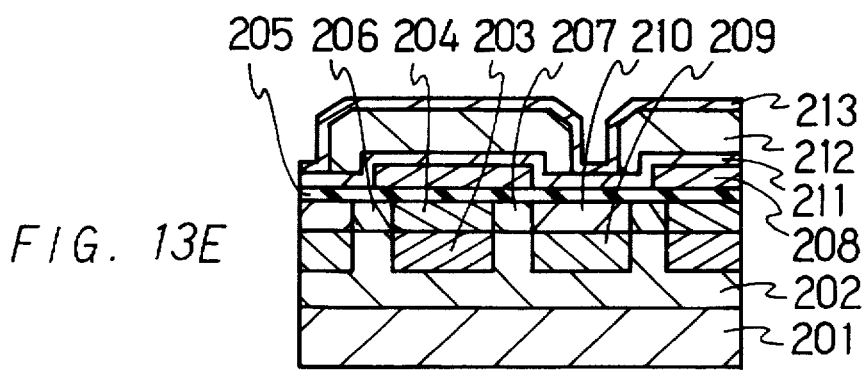

In FIG. 13A, a p-type well 202 is formed on an n-type semiconductor substrate 201. In this case, the concentration of the p-type well 202 was set to $1 \times 10^{16}$ cm$^{-3}$ or less in order to inhibit blooming. In FIG. 13B, a photoresist was applied, exposed and developed so that a photoresist mask 221 was formed. Then, boron ions were implanted into a predetermined area of the p-type well 202 at an acceleration energy of 100 KeV or more by using the photoresist mask 221. Thus, a p-type area 203 was formed. In FIG. 13C, phosphorus, arsenic or both impurities was/were implanted by using the photoresist mask 221 to form a n-type CCD transfer channel 204 on the surface of the n-type semiconductor substrate 201 of the p-type area 203 in the p-type well 202. In FIG. 13D, the photoresist mask 221 was removed to form a gate insulating film 205. Then, boron ions were implanted by using the photoresist as a mask to form a p-type area 206 for isolation and a p-type area 207 for read gate voltage control in contact with the n-type CCD transfer channel 204 and the p-type area 203. Then, a transfer gate electrode 208 was formed and phosphorus ions were implanted at an acceleration energy of 200 KeV or more in self-alignment with a resist mask for forming the pattern of gate electrode 208. Thereafter, a n-type photodiode 209 was formed. Subsequently, a p-type area 210 having a high concentration was formed on the photodiode surface. In FIG. 13E, an insulating film 211, a photo-shield film 212 and a protection film 213 were finally formed in this order. Thus, the CCD solid-state image pick-up device was manufactured.

The CCD solid-state image pick-up device manufactured in the above steps has the following advantages.

In the manufacturing steps according to the fifth example shown in FIGS. 13A to 13E, the CCD transfer channel 204 and the p-type area 203 are formed by the photoresist mask 221. Consequently, the positions of both ends of the CCD transfer channel 204 and the p-type area 203 can be always aligned. Consequently, the fluctuation of the read drive voltage, saturation characteristic and smear characteristic can be prevented from occurring due to a variation in mask alignment for forming the above areas. In the manufacturing steps according to the fifth example shown in FIGS. 13A to 13E, the CCD transfer channel 204 and the p-type area 203 are formed by the photoresist mask 221. Consequently, the manufacturing cost could be reduced more than in the manufacturing method of the prior art, in which the CCD transfer channel 204 and the p-type area 203 are produced by separate masks.

When the p-type area 203 approaches the surface of the semiconductor substrate 201, the thickness of the read channel is reduced. Consequently, the read drive voltage is raised. In order to prevent such state, it is necessary to implant boron ions to form the p-type area 203 at an acceleration energy of 100 KeV or more. In addition, if the p-type area 203 is formed in the deep portion of the p-type well 202, the n-type area 204 as a CCD transfer channel cannot be enclosed by the p-type area 206 and the p-type area 207. As a result, the saturation characteristic is degraded. In order to prevent such degradation, it is necessary to implant boron ions to form the p-type area 203 at an acceleration energy of 600 KeV or less.

If the n-type photodiode area 209 is formed in the deep portion of the p-well 202, the effective channel length is increased. Consequently, the read drive voltage is raised. In order to prevent such state, it is necessary to implant phosphorus ions to form the n-type photodiode area 209 as the photodiode at an acceleration energy of 1.2 MeV or less. In addition, it is necessary to form the p-type area 210 having a high concentration on the surface of the semiconductor substrate 201 of the n-type photodiode area 209, in order to eliminate the dark current. Hence, it is necessary to implant phosphorus ions to form the n-type area 209, as the photodiode, at an acceleration energy of 200 KeV or more.

According to the fifth example, the fluctuation of characteristics can be prevented from occurring due to a variation in alignment of an implantation mask at the manufacturing steps. Also, the manufacturing cost can be reduced by forming the implantation mask in the predetermined area of the semiconductor substrate, forming the p-type area in the predetermined area by means of the implantation mask, and forming the first n-type area on the semiconductor substrate surface side by means of the implantation mask.

While the gate electrode 208 was formed and ions were then implanted with self-alignment to form the n-type photodiode area 209 in the fifth example, ion implantation may be performed by using the photoresist as a mask just before forming the gate insulating film 205 because the structure of a CCD is not affected.

While the p-type area 203 is formed and the CCD transfer channel 204 is then formed in the above example, the CCD transfer channel 204 may be formed before forming the p-type area 203.

Sixth Example

Figure 19:
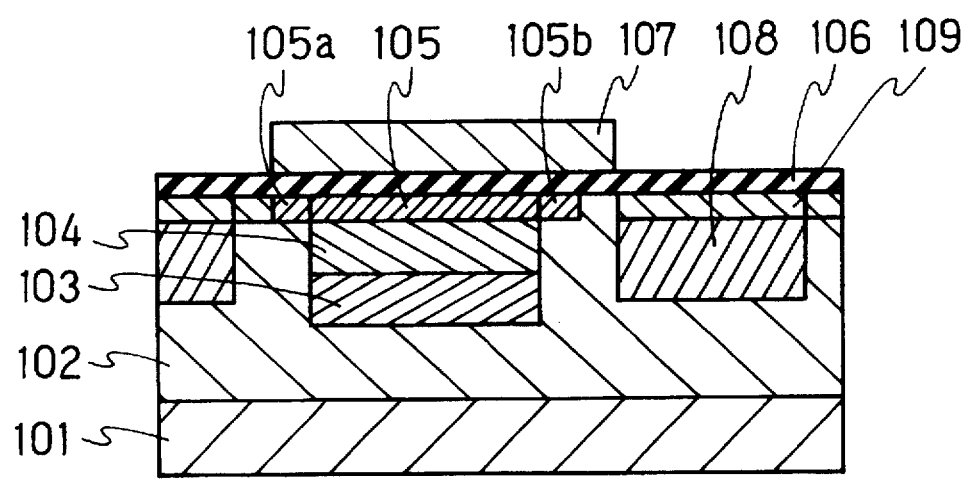
FIG. 19 is a sectional view showing the structure of a photodiode portion and a vertical CCD portion in a pixel portion of a CCD solid-state image pick-up device according to a sixth example of the present invention.

FIG. 19 is a sectional view showing the structure of a photodiode portion and a vertical CCD portion in a pixel portion of a CCD solid-state image pick-up device according to the sixth example. In FIG. 19, the reference numeral 105 denotes a p⁻ layer for electrically isolating a CCD n⁺ portion 104 from a photodiode n layer 108 and controlling the read of charges from the photodiode n layer 108 to the vertical CCD n⁺ portion 104. The p⁻ layer 105 is formed so as to include a second p-type well 103 and a part of the vertical CCD n⁺ portion 104 in the upper layer portion of an N (100) silicon substrate 101. The second p-type well 103 and the vertical CCD n⁺ layer 104 are formed at the same time. Consequently, the ends of the second p-type well 103 and vertical CCD n⁺ layer 104 are placed in the same positions. The reference numeral 105a denotes an isolating portion for electrically isolating the vertical CCD n⁺ portion 104 from the photodiode n layer 108 in the p⁻ layer 105. The reference numeral 105b denotes a read control portion for controlling the read of charges from the photodiode n layer 108 to the vertical CCD n⁺ portion 104 in the p⁻ layer 105. While the p⁻ layer 105 is formed so as to include a part of the second p-type well 103 as described above, it may be formed so as not to include a part of the second p-type well 103. The reference numeral 102 denotes a first p-type well formed on the silicon substrate 101. FIGS. 20A to 20D are sectional views showing the steps of manufacturing a CCD solid-state image pick-up device according to the present example shown in FIG. 19. In FIGS. 20A to 20D, the same reference numerals denote the same or corresponding portions as in FIG. 19. The manufacturing steps will be described below with reference to FIG. 20B.

Figure 20A:
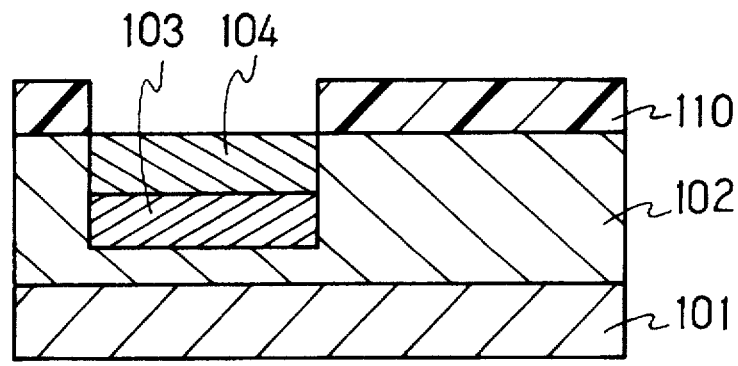
FIGS. 20A to 20D are sectional views showing the steps of manufacturing the CCD solid-state image pick-up device according to the sixth example shown in FIG. 19.
Figure 20B:
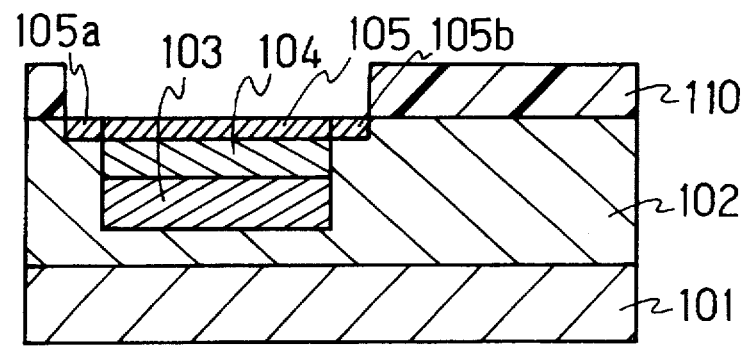
Figure 20C:
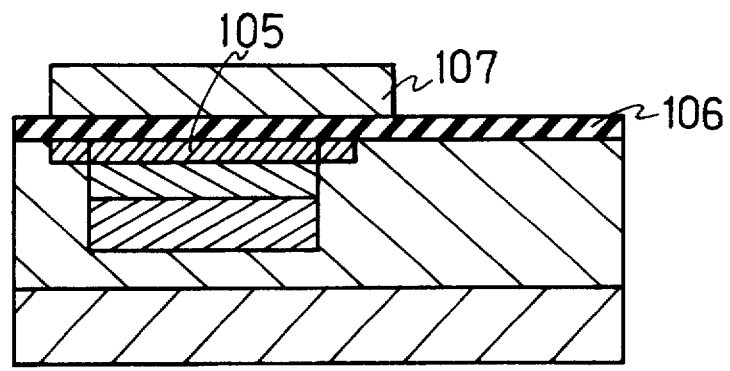
Figure 20D:
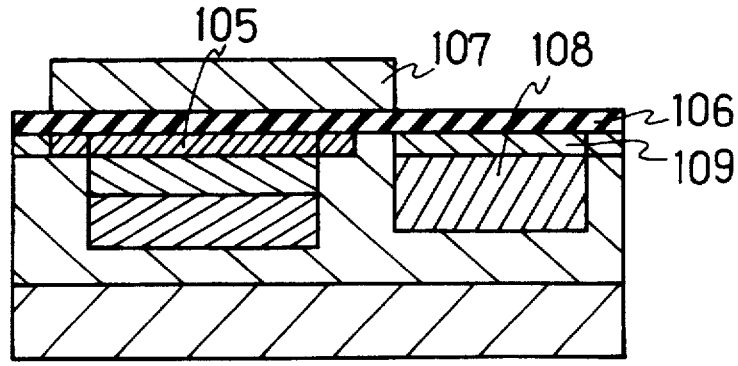

As shown in FIG. 20A, a first p-type well (carrier concentration of $10^{14}$ to $10^{15}$ cm$^{-3}$) 102 was formed on the N (100) silicon substrate 101. Then, a resist pattern 110 was formed on the surface of the substrate 101. Thereafter, a second p-type well (carrier concentration of $10^{15}$ to $10^{16}$ cm$^{-3}$) 103 and a vertical CCD n⁺ region (carrier concentration of $10^{16}$ to $10^{17}$ cm$^{-3}$) 104 were formed at the same time. As shown in FIG. 20B, a resist pattern 110 was formed. Then, boron was implanted with a dose of about $5\times10^{11}$ cm$^{-2}$ in a region which includes the vertical CCD n⁺ portion 104 except for a region in which the photodiode of the substrate 101 should be formed by using the resist pattern 110 as a mask. Thus, the p⁻ layer (carrier concentration of about $10^{16}$ cm$^{-3}$) 105 was formed. As shown in FIG. 20C, a gate insulating film 106 comprising SiO$_2$ was formed. Then, a polysilicon was deposited on the gate insulating film 106. By using the dry etching method, a read and transfer electrode, i.e. polysilicon electrode 107, was formed. As shown in FIG. 20D, the polysilicon electrode 107 was used as a mask to form an embedded photodiode n layer (carrier concentration of $5\times10^{15}$ to $5\times10^{16}$ cm$^{-3}$) 108 and an embedded photodiode p⁺ layer (carrier concentration of $10^{17}$ to $10^{20}$ cm$^{-3}$) 109 by ion implantation with self-alignment. Then, a layer insulating film and a photo-shield film (not shown) can be formed if necessary. Thus, a CCD solid-state image pick-up device was finished. Since the p⁺ layer 105 is formed by one-time ion implantation, an isolation region having the same carrier concentration as that of a p⁺ layer 115 for isolation of a device according to the prior art cannot be formed. However, if the overlap dimension of the polysilicon electrode 107 and the isolation region is reduced or the distance between the photodiode n layer 108 and the vertical CCD n⁺ layer 104 is increased, the vertical CCD n⁺ layer 104 can be electrically isolated from the photodiode n⁺ layer 108. The carrier concentration of each layer is obtained in the state where diffusion is caused by substrate annealing when the device is finished, that is, after impurity atoms are doped.

Seventh Example

Figure 21:
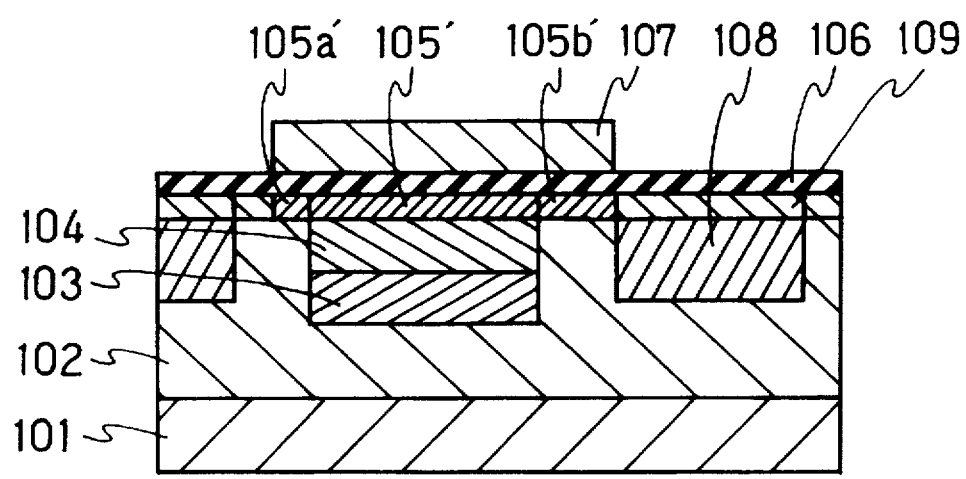
FIG. 21 is a sectional view showing the structure of a CCD solid-state image pick-up device according to a seventh example of the present invention.

FIG. 21 is a sectional view showing the structure of a CCD solid-state image pick-up device according to the present example. In FIG. 21, the same reference numerals denote the same or corresponding portions as in FIG. 20. The reference numeral 105' denotes a p⁻ layer for electrically isolating a vertical CCD n⁺ portion 104 and a photodiode n layer 108 and controlling the read of charges from the photodiode n layer 108 to the vertical CCD n⁺ portion 104. In the CCD solid-state image pick-up device of the present example, a second p-type well 103 and a vertical CCD n⁺ layer 104 are simultaneously formed by using a resist mask 110. In addition, boron ions are implanted over a wafer (N (100) silicon substrate 101) to form the p⁻ layer 105'. Thus, the CCD solid-state image pick-up device according to the present example is formed.

FIGS. 22A to 22D are sectional views showing the steps of manufacturing a CCD solid-state image pick-up device according to the present example shown in FIG. 21. In FIGS. 22A to 22D, the same reference numerals denote the same or corresponding portions as in FIG. 21. The manufacturing steps will be described below with reference to FIG. 20C.

Figure 22A:
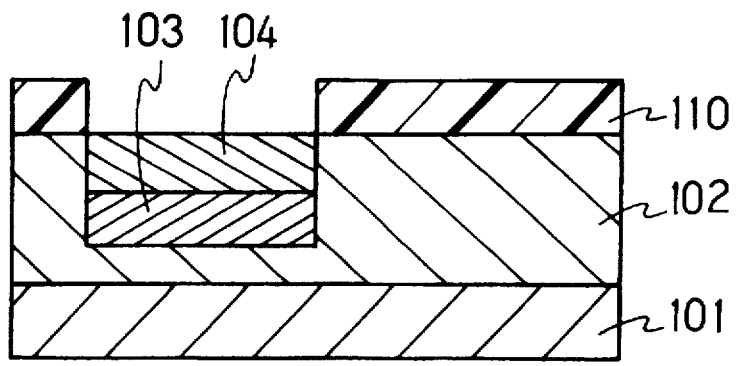
FIGS. 22A to 22D are sectional views showing the steps of manufacturing the CCD solid-state image pick-up device according to the seventh example shown in FIG. 21.
Figure 22B:
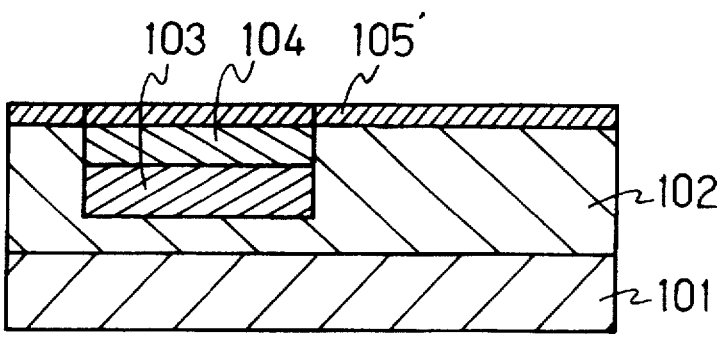
Figure 22C:
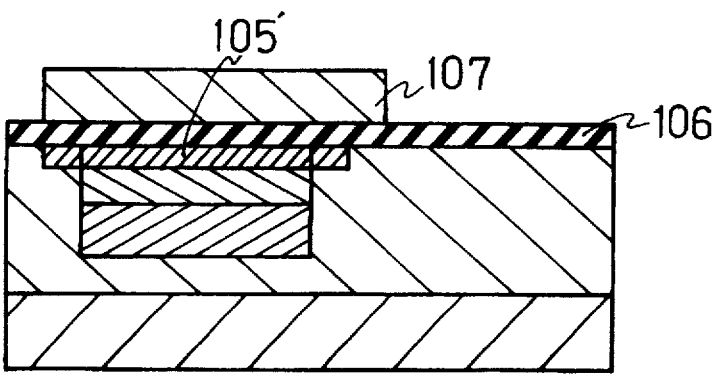
Figure 22D:
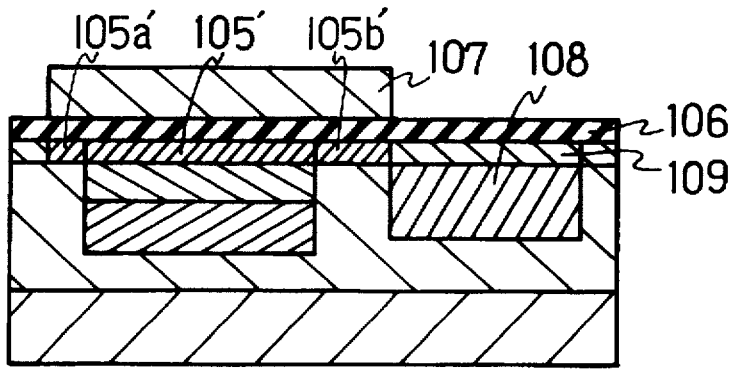

As shown in FIG. 22A, the resist pattern 110 was formed on the surface of the N (100) silicon substrate 101 in the same manner as in the sixth example. Then, the second p-type well (carrier concentration: $10^{15}$ to $10^{16}$ cm$^{-3}$) 103 and the vertical CCD n area (carrier concentration: $10^{16}$ to $10^{17}$ cm$^{-3}$) 104 were formed at the same time. As shown in FIG. 22B, boron ions were implanted with a dose of about $5\times10^{11}$ cm$^{-2}$ over the N (100) silicon substrate 101 to form the p⁻ layer 105'. As shown in FIG. 22C, a gate insulating film 106 comprising SiO$_2$ was formed. Then, a polysilicon was deposited on the gate insulating film 106. By using the dry etching method, a read and transfer electrode, i.e. polysilicon electrode 107, was formed. As shown in FIG. 22D, the polysilicon electrode 107 was used as a mask to form an embedded photodiode n layer 108 and an embedded photodiode p⁺ layer 109 by ion implantation with self-alignment. Then, a layer insulating film and a photo-shield film (not shown) were formed if necessary. Thus, the CCD solid-state image pick-up device was finished. At the step of implanting ions during the formation of the p⁻ layer 105', acceleration energy was set in such a manner that the p⁺ layer 105' is taken into the embedded photodiode p⁺ layer 109 when terminating the step of forming the device (FIG. 22D). If the acceleration energy was set at the step of implanting ions during the formation of the p⁻ layer 105' in such a manner that the p⁻ layer 105' was formed in a deeper position than the embedded photodiode p⁺ layer 109, the dose of impurity ions was increased when forming the embedded photodiode n layer 108. Thus, the influence of the p⁻ layer 105' layer on the photodiode portion is eliminated.

While the p⁻ layer 105 or 105' for performing electric isolation among the second p-type well 103, the vertical CCD n⁺ layer 104 and the photodiode n layer 108 before the formation of the gate insulating film and for controlling the read of charges from the photodiode n layer 108 to the vertical CCD n⁺ portion 104 was formed in the present example, the second p-type well 103, the vertical CCD n⁺ layer 104 and the p⁻ layer 105 may be formed after the formation of the gate insulating film 106 in respect of a reduction in total heat treatment.

According to the seventh example, the p⁻ layer 105' which electrically isolates the vertical CCD n⁺ portion 104 from the photodiode n layer 108 and controls the read of charges from the photodiode n layer 108 to the vertical CCD n⁺ portion 104 was not selectively formed but over the N (100) silicon substrate 101. Consequently, it is not necessary to form a resist mask (resist pattern 110) described in the sixth example. Thus, the manufacturing steps could be simplified more than in the sixth example.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A solid-state image pick-up device, comprising:
   a plurality of pixel portions arranged as an array on a semiconductor substrate having a surface layer, each of said pixel portions including a photodiode portion, a vertical transfer portion for transferring charges, and a control portion for controlling the reading of the charges from said photodiode portion, wherein:
      an isolating portion for isolating said vertical transfer portion from the adjacent photodiode portion is formed between said pixel portions, and
      said control portion is formed on the entire surface layer of said semiconductor substrate between said photodiode portion and said vertical transfer portion.

2. The solid-state image pick-up device of claim 1, wherein said vertical transfer portion is made from an n-type diffusion layer, and the impurity atoms forming said n-type diffusion layer are selected from the group containing phosphorus and arsenic.

3. The solid-state image pick-up device of claim 1, wherein said controlling portion and said isolating portion are formed by diffusion of impurity atoms into the entire surface of said semiconductor substrate.

4. The solid-state image pick-up device of claim 3, wherein a surface layer having a reverse conductivity type to said photodiode portion is formed on the surface of said photodiode portion, and the depth of said controlling portion or said isolating portion from the surface of said semiconductor substrate is smaller than the depth of said surface layer from the surface of said semiconductor substrate.

5. The solid-state image pick-up device of claim 1 or of claim 3, wherein said isolating portion is wider than said controlling portion.

6. The solid-state image pick-up device of claim 1 or claim 3, wherein said vertical transfer portion has a border and is made from an n-type diffusion layer, and a p-type diffusion layer having a border is formed just below said vertical transfer portion, and the border of said vertical transfer portion and the border of said p-type diffusion layer are substantially matched at least at said control portion and/or at said isolating portion.

7. A solid-state image pick-up device, comprising:
   a plurality of pixel portions arranged as an array on a semiconductor substrate, each of said pixel portions including a photodiode portion, a vertical transfer portion for transferring charges, and a control portion for controlling the reading of the charges from said photodiode portion, wherein:
      an isolating portion for isolating said vertical transfer portion from the adjacent photodiode portion is formed between said pixel portions,
      said vertical transfer portion having a border and comprising an n-type diffusion layer,
      a p-type diffusion layer having a border is formed just below said vertical transfer portion, and
      the border of said vertical transfer portion and the border of said p-type diffusion layer are substantially matched at least at said control portion or at said isolating portion.

8. The solid-state image pick-up device of claim 7, wherein the impurity atoms forming said vertical transfer portion are selected from the group containing phosphorus and arsenic.

* * * * *